(12) United States Patent
Nakajima et al.

(10) Patent No.: US 10,825,601 B2
(45) Date of Patent: Nov. 3, 2020

(54) COIL COMPONENT AND ELECTRONIC DEVICE

(71) Applicant: TAIYO YUDEN CO., LTD., Tokyo (JP)

(72) Inventors: Takashi Nakajima, Takasaki (JP); Naoya Terauchi, Takasaki (JP); Shinsuke Takeoka, Takasaki (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 16/292,720

(22) Filed: Mar. 5, 2019

(65) Prior Publication Data

US 2019/0295764 A1 Sep. 26, 2019

(30) Foreign Application Priority Data

Mar. 20, 2018 (JP) .................. 2018-053182

(51) Int. Cl.
*H01F 27/02* (2006.01)
*H01F 27/06* (2006.01)
*H01F 27/22* (2006.01)
*H01F 27/28* (2006.01)
*H01F 27/29* (2006.01)
(Continued)

(52) U.S. Cl.
CPC ......... *H01F 27/2804* (2013.01); *H01F 27/24* (2013.01); *H01F 27/292* (2013.01); *H01F 27/323* (2013.01); *H05K 1/181* (2013.01); *H01F 2027/2809* (2013.01); *H05K 2201/1003* (2013.01)

(58) Field of Classification Search
CPC .......... H01F 27/02; H01F 27/06; H01F 27/22; H01F 27/28; H01F 27/29; H01F 27/255; H01F 3/02; H01F 3/08; H01F 5/00; H01F 17/00; H01F 17/04; H01F 17/0013
USPC ...... 174/260; 336/55, 83, 90, 177, 192, 200, 336/233
See application file for complete search history.

(56) References Cited

U.S. PATENT DOCUMENTS 10,147,540 B2 * 12/2018 Tonoyama .............. H01F 41/04
2013/0002383 A1 * 1/2013 Esaki .................... H01F 27/255
336/90
(Continued)

FOREIGN PATENT DOCUMENTS

JP 2010062424 A 3/2010
JP 2014053396 A 3/2014

*Primary Examiner* — Xiaoliang Chen
(74) *Attorney, Agent, or Firm* — Law Office of Katsuhiro Arai

(57) ABSTRACT

In an exemplary embodiment, a coil component includes: an element body part 10 that contains magnetic metal grains and nonmagnetic materials and has insulation property; and a coil 30 embedded in the element body part 10 and formed by a winding conductor. The element body part 10 has a main part 11 and a low magnetic permeability part 50 whose relative permeability is lower than that of the main part 11; the coil 30 has a first surface 36 and a second surface 38 respectively representing surfaces positioned on opposite sides in the direction of the coil axis and intersecting the coil axis; and the low magnetic permeability part 50 is provided between a first plane 37 flush with the first surface 36, and a second plane 39 flush with the second surface 38, in a manner away from the first plane 37 and the second plane 39.

10 Claims, 15 Drawing Sheets

(51) Int. Cl.
  *H01F 27/255* (2006.01)
  *H01F 3/02* (2006.01)
  *H01F 3/08* (2006.01)
  *H01F 5/00* (2006.01)
  *H01F 17/00* (2006.01)
  *H01F 17/04* (2006.01)
  *H05K 1/18* (2006.01)
  *H01F 27/32* (2006.01)
  *H01F 27/24* (2006.01)

(56) References Cited

U.S. PATENT DOCUMENTS

| | | | | |
|---|---|---|---|---|
| 2013/0222101 | A1* | 8/2013 | Ito | H01F 17/04 336/83 |
| 2014/0009254 | A1* | 1/2014 | Ohkubo | H01F 27/2804 336/192 |
| 2014/0077914 | A1* | 3/2014 | Ohkubo | H01F 5/00 336/177 |
| 2015/0002255 | A1* | 1/2015 | Kim | H01F 27/255 336/233 |
| 2016/0155550 | A1* | 6/2016 | Ohkubo | H01F 1/24 336/233 |
| 2016/0163444 | A1* | 6/2016 | Choi | H01F 17/0013 336/200 |
| 2016/0240296 | A1* | 8/2016 | Kim | H01F 27/292 |
| 2016/0268040 | A1* | 9/2016 | Kim | H01F 17/0013 |
| 2016/0293319 | A1* | 10/2016 | Hong | H01F 27/255 |
| 2016/0314889 | A1* | 10/2016 | Ryu | H01F 27/255 |
| 2016/0343498 | A1* | 11/2016 | Lee | H01G 4/005 |
| 2016/0351315 | A1* | 12/2016 | Park | H01F 27/292 |
| 2016/0351318 | A1* | 12/2016 | Jeong | H01F 17/0013 |
| 2017/0004915 | A1* | 1/2017 | Park | H01F 27/255 |
| 2017/0032885 | A1* | 2/2017 | Lee | H01F 27/292 |
| 2017/0040101 | A1* | 2/2017 | Jeong | H01F 27/2804 |
| 2017/0154720 | A1* | 6/2017 | Ohkubo | H01F 27/022 |
| 2017/0178789 | A1* | 6/2017 | Kim | H01F 27/2804 |
| 2017/0178798 | A1* | 6/2017 | Yoon | H01F 27/292 |
| 2017/0194084 | A1* | 7/2017 | Choi | H01F 27/022 |
| 2017/0221622 | A1* | 8/2017 | Park | H01F 27/22 |
| 2017/0236633 | A1* | 8/2017 | Park | H01F 27/22 336/55 |
| 2017/0256353 | A1* | 9/2017 | Park | C08K 3/28 |
| 2017/0287621 | A1* | 10/2017 | Seino | H01F 27/292 |
| 2017/0345551 | A1* | 11/2017 | Yoshioka | H01F 27/2804 |
| 2017/0345556 | A1* | 11/2017 | Kim | H01F 41/042 |
| 2018/0019051 | A1* | 1/2018 | Bong | H01F 17/0013 |
| 2018/0061552 | A1* | 3/2018 | Yang | H01F 27/292 |
| 2018/0114619 | A1* | 4/2018 | Kim | H01F 17/0013 |
| 2018/0158584 | A1* | 6/2018 | Park | H01F 5/003 |
| 2018/0166194 | A1* | 6/2018 | Choi | H01F 17/04 |
| 2018/0211762 | A1* | 7/2018 | Jung | H01F 27/2804 |
| 2018/0240586 | A1* | 8/2018 | Yoon | H01F 17/0013 |
| 2018/0261377 | A1* | 9/2018 | Kim | H01F 17/0013 |
| 2018/0268988 | A1* | 9/2018 | Lee | H01F 27/2804 |
| 2018/0366246 | A1* | 12/2018 | Park | H01F 17/0013 |
| 2018/0374627 | A1* | 12/2018 | Ryu | H01F 27/2804 |

* cited by examiner

COIL COMPONENT AND ELECTRONIC DEVICE

BACKGROUND

Field of the Invention

The present invention relates to a coil component and an electronic device.

Description of the Related Art

Power supply circuits, DC/DC converter circuits, and other electronic devices use coil components. Types of coil components characterized by comprising an element body part constituted primarily by magnetic metal grains and also having insulation property and a coil built into the element body part, are known. For example, methods have been proposed for manufacturing a coil component that comprises an element body part constituted primarily by magnetic metal grains and a coil built into the element body part, whereby the element body part can be better insulated with the use of glass, without causing the adverse effect of having to increase the conductor resistance of the coil (refer to Patent Literature 1, for example). Also, constitutions of a coil component that comprises an element body part formed by a ferrite and a coil built into the element body part are known, wherein a nonmagnetic layer exposed to the surface of the element body part is provided in a region surrounded by the conductor patterns constituting the coil to improve direct-current superimposition property (refer to Patent Literature 2, for example).

BACKGROUND ART LITERATURES

[Patent Literature 1] Japanese Patent Laid-open No. 2010-062424
[Patent Literature 2] Japanese Patent Laid-open No. 2014-053396

SUMMARY

When a low magnetic permeability part whose relative permeability is lower than that of the main part of the element body part is provided inside the element body part for the purpose of improving direct-current superimposition properties, the magnetic permeability of the main part of the element body part becomes sufficiently high, if the element body part is formed by a ferrite, and therefore any leakage of magnetic flux near the low magnetic permeability part is limited. If the element body part is formed by a material that contains magnetic metal grains, however, it is difficult to increase the magnetic permeability of the main part of the element body part to a sufficiently high level and consequently a large leakage of magnetic flux occurs near the low magnetic permeability part. As magnetic flux leaks into the conductor constituting the coil, eddy current will generate in the conductor and copper losses will occur. Also, the inductance value will drop, which is not desirable even when a low magnetic permeability part is provided inside the element body part to improve direct-current superimposition properties.

The present invention was developed in light of the aforementioned problems, and its object is to keep the losses low while maintaining the inductance value at an equivalent level.

Any discussion of problems and solutions involved in the related art has been included in this disclosure solely for the purposes of providing a context for the present invention, and should not be taken as an admission that any or all of the discussion were known at the time the invention was made.

The present invention is a coil component comprising: an element body part that contains magnetic metal grains and nonmagnetic materials and has insulation property; and a coil that is built into the element body part and formed by a winding conductor; wherein the element body part has a main part of the element body part and a low magnetic permeability part whose relative permeability is lower than that of the main part of the element body part; the coil has a first surface and a second surface that respectively represent surfaces positioned on opposite sides in the direction of the coil axis and intersecting with the coil axis; and the low magnetic permeability part is provided between a first plane that forms a plane flush with the first surface of the coil, and a second plane that forms a plane flush with the second surface of the coil, in a manner away from the first plane and the second plane.

The aforementioned constitution may be such that the low magnetic permeability part is provided in an inner region surrounded by the coil, on the inner side of an outer region which is present on the side of the coil closer to the surface of the element body part.

The aforementioned constitution may be such that the low magnetic permeability part is provided in a manner covering the entire cross-section of the inner region surrounded by the coil, as viewed from the direction of the coil axis.

The aforementioned constitution may be such that the element body part has multiple low magnetic permeability parts that each conform to the aforementioned low magnetic permeability part.

The aforementioned constitution may be such that the relative permeability of the main part of the element body part is 100 or lower, while the total thickness of the low magnetic permeability part(s) in the direction of the coil axis is smaller than 40 μm.

The aforementioned constitution may be such that the relative permeability of the main part of the element body part is 100 or lower, while the total thickness T μm of the low magnetic permeability part(s) in the direction of the coil axis is equal to or greater than one-fifth, but no greater than one-half, the relative permeability $\mu_r$ of the main part of the element body part ($\mu_r/5 \le T \le \mu_r/2$).

The aforementioned constitution may be such that the element body part is formed by multiple layers that include those of the conductor that forms the coil and magnetic films constituted primarily by the magnetic metal grains.

The aforementioned constitution may be such that the low magnetic permeability part is positioned between layers of the conductor.

The aforementioned constitution may further include external electrodes provided on the surface of the element body part, and lead conductors provided inside the element body part and connecting the ends of the coil to the external electrodes.

The present invention is an electronic device comprising any of the coil components described above and a circuit board on which the coil component is mounted.

According to the present invention, losses can be kept low while maintaining the inductance value at an equivalent level.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are greatly simplified for illustrative purposes and are not necessarily to scale.

FIG. 3A is a plan view, while

FIGS. 7A and 7B are cross-sectional views of the coil component pertaining to Comparative Example 1, while

FIGS. 9A and 9B are cross-sectional views of the coil component pertaining to Variation Example 1 of Example 1, while

FIGS. 11A and 11B are cross-sectional views of the coil component pertaining to Example 2, while

FIGS. 12A and 12B are cross-sectional views of the coil component pertaining to Variation Example 2 of Example 2, while

FIGS. 14A and 14B are cross-sectional views showing one layer of the low magnetic permeability part provided in the inner region surrounded by the coil, while

DESCRIPTION OF THE SYMBOLS

Figure 1A:
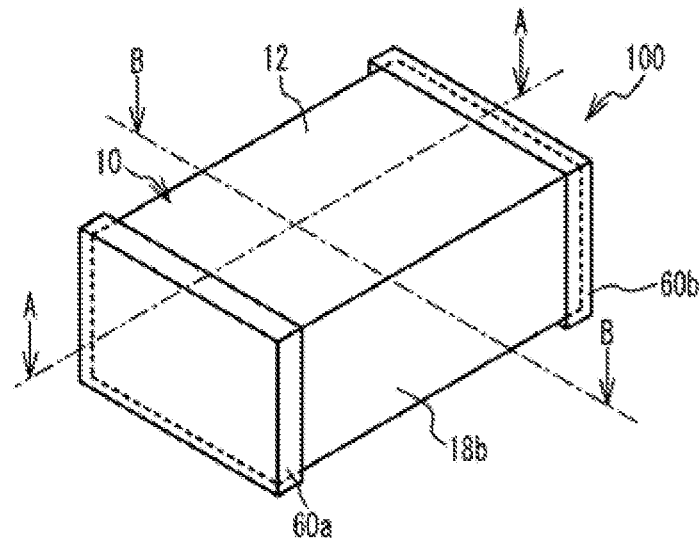
FIG. 1A is a perspective view of the coil component pertaining to Example 1.

10 Element body part
11 Main part of element body part
12 Top face
14 Bottom face
16$a$, 16$b$ End face
18$a$, 18$b$ Side face
20 Layer
21 Cover layer
22 Insulation layer
24 Inner region
26 Outer region
30 Coil
32 to 32$b$ Winding conductor
34 Connection conductor
36 First surface
37 First plane
38 Second surface
39 Second plane
40$a$, 40$b$ Lead conductor
50 Low magnetic permeability part
52$a$ First layer
52$b$ Second layer
60$a$, 60$b$ External electrode
70 Film
72 Magnetic film
74 Green sheet
90 Circuit board
92 Electrode
94 Solder
100, 110, 120 Coil component
200, 210, 220, 230 Coil component
300 Electronic device
500, 600 Coil component

DETAILED DESCRIPTION OF EMBODIMENTS

Examples of the present invention are explained below by referring to the drawings.

Example 1

Figure 1B:
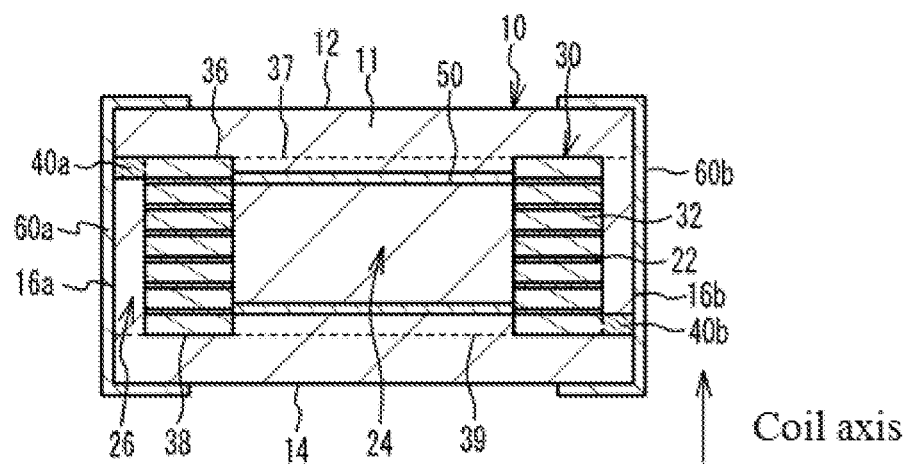
FIG. 1B is a view of cross-section A-A in FIG. 1A.
Figure 1C:
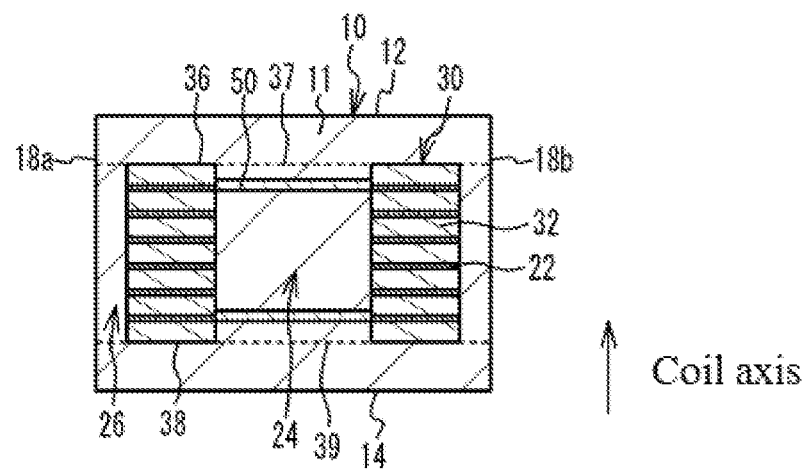
FIG. 1C is a view of cross-section B-B in FIG. 1A.
Figure 2A:
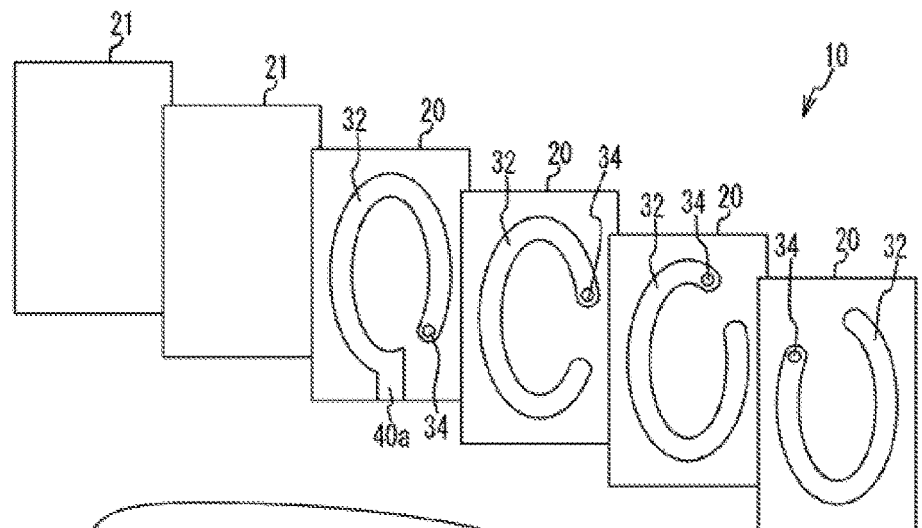
FIG. 2A is an exploded plan view of the element body part of the coil component pertaining to Example 1.
Figure 2B:
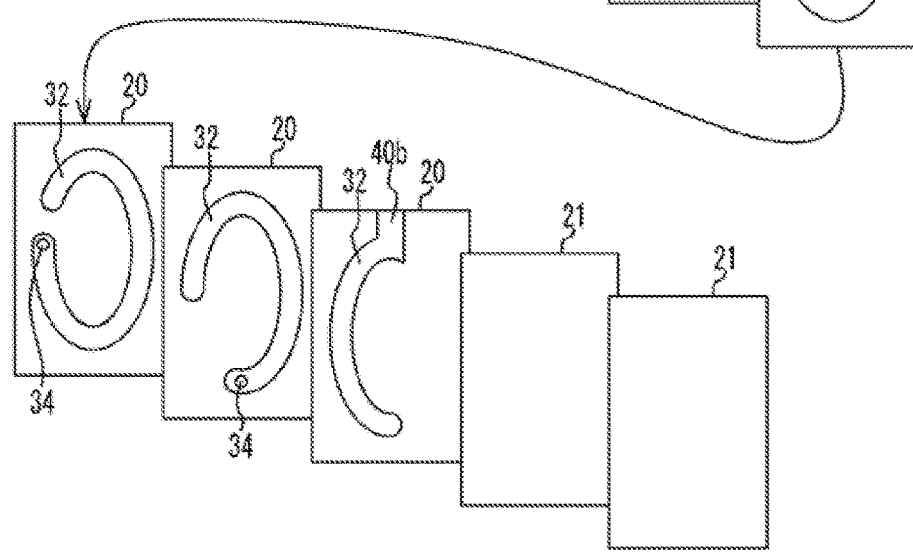
FIG. 2B is a plan view showing the interior of the element body part.
Figure 2B:
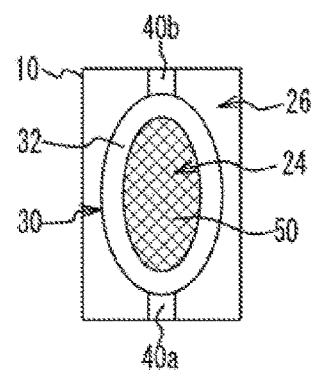

FIG. 1A is a perspective view of the coil component pertaining to Example 1, FIG. 1B is a view of cross-section A-A in FIG. 1A, and FIG. 1C is a view of cross-section B-B in FIG. 1A. FIG. 2A is an exploded plan view of the element body part of the coil component pertaining to Example 1, and FIG. 2B is a plan view showing the interior of the element body part. As shown in FIGS. 1A to 1C, the coil component 100 in Example 1 comprises an element body part 10 and external electrodes 60$a$, 60$b$. Provided in the element body part 10 are a coil 30, lead conductors 40a, 40b, and one or multiple low magnetic permeability parts 50. It should be noted that, in the element body part 10, a part, other than the low magnetic permeability part(s), having the same constitutional makeup and accounting for a large portion of the volume of the element body part 10 is referred to as the "main part 11" of the element body part 10.

The element body part 10 is shaped as a rectangular solid having a top face 12, a bottom face 14, a pair of end faces 16a, 16b, and a pair of side faces 18a, 18b. The bottom face 14 is a mounting face, while the top face 12 is a face on the opposite side of the bottom face 14. The end faces 16a, 16b are faces connected to the short sides of the top face 12 and bottom face 14. The side faces 18a, 18b are faces connected to the long sides of the top face 12 and bottom face 14. The shape of the element body part 10 is not limited to a perfect rectangular solid, and it may be an approximate rectangular solid having rounded apexes, rounded ridges (boundaries of faces), curved faces, or the like.

The element body part 10 has insulation property and is formed in such a way that it contains magnetic metal grains and nonmagnetic materials. For example, the element body part 10 is constituted primarily by magnetic metal grains. It is "constituted primarily by" magnetic metal grains when the content of magnetic metal grains is more than 50 percent by weight, or preferably 70 percent by weight or more, or more preferably 80 percent by weight or more, for example. The element body part 10 is formed by a resin that contains magnetic metal grains, for example, but it may also be formed by sintering magnetic metal grains whose surfaces are insulation-coated. For the magnetic metal grains, a FeSiCr-based, FeSiAl-based, FeSiCrAl-based, or other soft magnetic metal, Fe, Ni, or other magnetic metal, amorphous magnetic metal, nanocrystal magnetic metal, etc., is used. In one example, the element body part 10 is formed in such a way that the content of Fe, as magnetic metal grains, is 90 percent by weight or more. In another example, the average grain size of the magnetic metal grains contained in the element body part 10 is 5 μm or smaller. For the resin, a polyimide resin, phenolic resin, or other thermosetting resin may be used, or a polyethylene resin, polyamide resin, or other thermoplastic resin may be used, for example. For the insulation film that coats the surfaces of the metal magnetic grains, glass or other inorganic insulation material is used, for example.

As shown in FIG. 2A, the element body part 10 is formed by a stack of multiple layers 20 on which winding conductors 32 and connection conductors 34 are provided, as well as cover layers 21. The multiple layers 20 and cover layers 21 are formed in such a way that they include a magnetic film constituted primarily by magnetic metal grains. The winding conductors 32 provided on each adjacent pair of layers 20 among the multiple layers 20 are connected to each other via a connection conductor 34 that penetrates through the layer 20 in its thickness direction. As a result, the winding conductors 32 extend helically through the connection conductors 34. This way, the coil 30, which is built into the element body part 10, is formed, as shown in FIGS. 1B and 1C. The coil 30 has a specified number of windings, as well as a coil axis that crosses roughly at right angles with the plane specified by the windings. In Example 1, seven layers of winding conductors 32 are stacked together, and the coil 30 is wound by 5.5 turns.

As shown in FIG. 2B, the coil 30, when seen in plan view from the stacking direction of the multiple layers 20, has a ring shape formed by the winding conductors 32 on the multiple layers 20 stacked. The winding conductors 32 and connection conductors 34 (i.e., the coil 30) are formed by copper, aluminum, nickel, silver, platinum, palladium, or other metal material, or an alloyed metal material containing the foregoing, for example.

As shown in FIGS. 1B and 1C, an insulation layer 22 whose relative permeability is lower than that of the main part 11 of the element body part 10 and which has insulation property, is provided between the winding conductors 32 on each adjacent pair, in the stacking direction, of the multiple winding conductors 32 that are stacked together. The insulation layer 22 is formed by a polyimide resin or other resin material, for example, but it may also be formed by glass or other inorganic insulating material or any other material. The thickness of the insulation layer 22 in the direction of the coil axis may be smaller than the thickness of the winding conductor 32 in the direction of the coil axis. For example, the thickness of the winding conductor 32 in the direction of the coil axis is approx. 50 μm, while the thickness of the insulation layer 22 in the direction of the coil axis is approx. 10 μm.

The lead conductors 40a, 40b are led out from the coil 30. The lead conductor 40a is led out from the coil 30 toward the end face 16a of the element body part 10, while the lead conductor 40b is led out from the coil 30 toward the end face 16b of the element body part 10. The ends of the lead conductors 40a, 40b are exposed from the element body part 10 on the end faces 16a, 16b of the element body part 10. The lead conductors 40a, 40b are formed by the same metal as the coil 30, for example, but it may also be formed by a different metal from the coil 30.

The external electrodes 60a, 60b are external terminals used for surface mounting. As shown in FIGS. 1A and 1B, the external electrode 60a extends from the bottom face 14, via the end face 16a, to the top face 12, while partially covering the side faces 18a, 18b, of the element body part 10. The external electrode 60b extends from the bottom face 14, via the end face 16b, to the top face 12, while partially covering the side faces 18a, 18b, of the element body part 10. In other words, the external electrodes 60a, 60b are pentahedral electrodes extending to five faces of the element body part 10. It should be noted that the external electrodes 60a, 60b may also be trihedral electrodes extending from the bottom face 14, via the end face 16a or 16b, to the top face 12, of the element body part 10, or electrodes of other configurations.

The end of the lead conductor 40a is exposed from the element body part 10 on the end face 16a of the element body part 10, and the external electrode 60a is connected to the lead conductor 40a on the end face 16a of the element body part 10. The end of the lead conductor 40b is exposed from the element body part 10 on the end face 16b of the element body part 10, and the external electrode 60b is connected to the lead conductor 40b on the end face 16b of the element body part 10. The external electrodes 60a, 60b are formed by multiple metal layers, for example. The external electrodes 60a, 60b have, for example, a multi-layer structure comprising: a bottom layer formed by copper, aluminum, nickel, silver, platinum, palladium, or other metal material, or an alloyed metal material containing the foregoing; a middle layer formed by silver or a conductive resin containing silver; and a top layer being a nickel and/or tin plating layer. The layer constitution of the external electrodes 60a, 60b is not limited to the layers being illustrated, and each layer may comprise multiple layers including an intermediate layer between the respective layers, or a topmost layer may be provided on top of the top layer.

As shown in FIGS. 1B, 1C and 2B, the low magnetic permeability part 50 is provided inside the element body part 10. The low magnetic permeability part 50 has a relative permeability lower than the relative permeability of the main part 11 of the element body part 10, as well as insulation property. The low magnetic permeability part 50 is formed by a polyimide resin or other resin material, for example, but it may also be formed by glass, aluminum oxide, or other oxide material, or other nonmagnetic material. The low magnetic permeability part 50 may be formed by a magnetic material, or it may also be formed by a combination of magnetic and nonmagnetic materials, so long as its relative permeability is lower than that of the main part 11 of the element body part 10. The low magnetic permeability part 50, for example, is formed by the same material as the insulation layer 22, but it may also be formed by a different material. The ratio of the relative permeability of the main part 11 of the element body part 10 to the specific permeability of the low magnetic permeability part 50 is 10 times or greater, or desirably 20 times or greater. This way, direct-current superimposition properties can be improved, while the coil component 100 can also be made smaller because the greater the difference in relative permeability, the further the thickness of the low magnetic permeability layer can be reduced.

The low magnetic permeability part 50 is provided inside an inner region 24 surrounded by the coil 30 between a first plane 37 that forms a plane flush with the first surface 36 of the coil 30, and a second plane 39 that forms a plane flush with the second surface 38 of the coil 30, in a manner away from the first plane 37 and the second plane 39. In other words, the low magnetic permeability part 50 is provided in the inner region 24 surrounded by the coil 30, being positioned on the second plane 39 side of the first plane 37 and on the first plane 37 side of the second plane 39. The first surface 36 and second surface 38 of the coil 30 are, among the coil 30 surfaces, the surfaces positioned on both sides in the direction of the coil axis and crossing at right angles with the coil axis. In other words, the first surface 36 and second surface 38 of the coil 30 are, among the coil 30 surfaces, the surfaces respectively positioned on opposite sides in the direction of the coil axis and crossing at right angles with the coil axis.

Figure 3A:
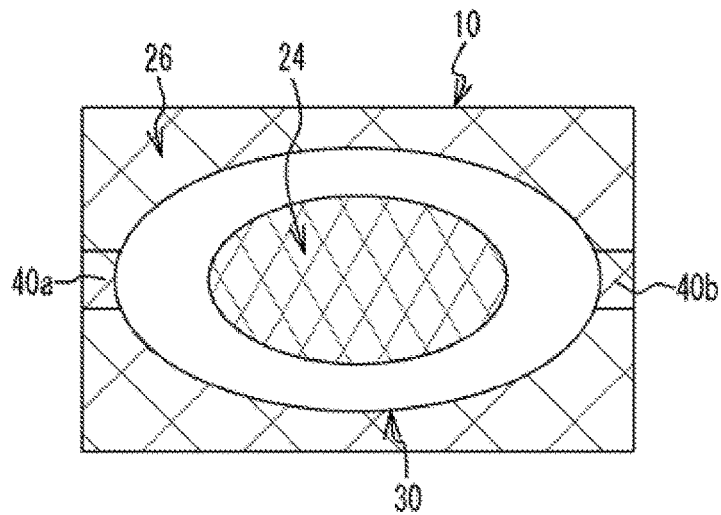
Figure 3B:
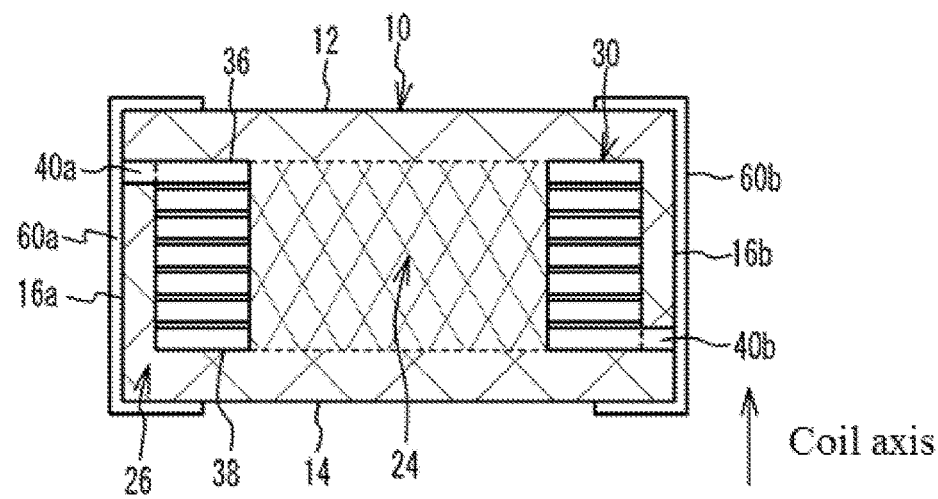
FIGS. 3B and 3C are cross-sectional views, explaining the inner region surrounded by the coil and the outer region present on the outer side of the coil.
Figure 3C:
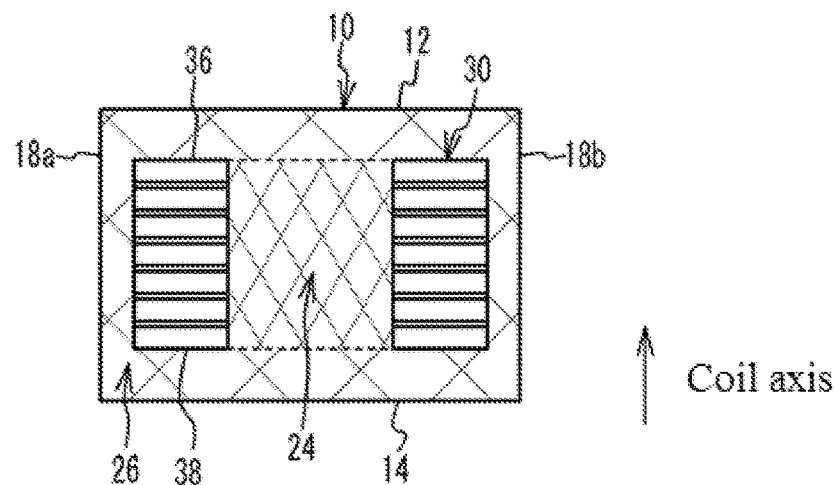

Now, FIGS. 3A to 3C are used to explain the inner region 24 surrounded by the coil 30, and the outer region 26 on the side of the coil 30 closer to the surface of the element body part 10. FIG. 3A is a plan view, while FIGS. 3B and 3C are cross-sectional views, explaining the inner region surrounded by the coil and the outer region present on the outer side of the coil. It should be noted that, in FIGS. 3A to 3C, the areas other than the inner region 24 and outer region 26 are not hatched for the purpose of illustrative clarification. As shown in FIGS. 3A to 3C, the region surrounded by the coil 30 inside the element body part 10 (finely crosshatched region in FIGS. 3A to 3C) represents the inner region 24. Inside the element body part 10, the region on the side of the coil 30 closer to the surface of the element body part 10 (coarsely crosshatched region in FIGS. 3A to 3C) represents the outer region 26.

As shown in FIGS. 1B, 1C, and 2B, the low magnetic permeability part 50 is provided in a manner covering the cross-section, as viewed from the direction of the coil axis, of the inner region 24 surrounded by the coil 30. For example, the low magnetic permeability part 50 is provided over the whole area of the inner region 24 when viewed in perspective from the direction of the coil axis. The phrase "provided over the whole area" may mean one low magnetic permeability part 50 is provided, or a combination of multiple low magnetic permeability parts 50 is provided, over the whole area. In other words, here, "covering" means the low magnetic permeability part 50 is provided in a manner cutting off magnetic flux running through the coil axis. In FIG. 2B, the area where the low magnetic permeability part 50 is provided is crosshatched. In Example 1, two layers of low magnetic permeability parts 50 are provided in the inner region 24 surrounded by the coil 30 which is formed by a stack of seven layers of winding conductors 32. When the stacked winding conductors 32 are counted as the first through seventh layers starting from the top face 12 side of the element body part 10, one low magnetic permeability part 50 is provided in the inner region 24 at a position between the first layer and the second layer, and its face on the top-face 12 side of the element body part 10 is positioned on the side of the first plane 37 closer to the bottom face 14 of the element body part 10. The other low magnetic permeability part 50 is provided in the inner region 24 at a position between the sixth layer and the seventh layer, and its face on the bottom-face 14 side of the element body part 10 is positioned on the side of the second plane 39 closer to the top face 12 of the element body part 10.

The thickness of the low magnetic permeability part 50 in the direction of the coil axis is smaller than the thickness of the winding conductor 32 in the direction of the coil axis. Also, the thickness of the low magnetic permeability part 50 in the direction of the coil axis is, for example, greater than the thickness of the insulation layer 22 in the direction of the coil axis, but it may also be the same as, or equivalent to, or smaller than, the thickness of the insulation layer 22 in the direction of the coil axis.

Next, how the coil component pertaining to Example 1 is manufactured, is explained. FIGS. 4A to 4E, 5A to 5D, and 6A to 6D, are cross-sectional views illustrating a method for manufacturing the coil component pertaining to Example 1. The coil component 100 in Example 1 is formed by stacking together layers formed according to FIGS. 4A to 4E, layers formed according to FIGS. 5A to 5D, and layers formed according to FIGS. 6A to 6D, and the like.

Figure 4A:
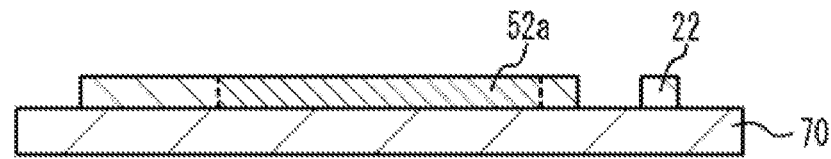
FIGS. 4A to 4E are cross-sectional views (Part 1) illustrating how the coil component pertaining to Example 1 is manufactured.
Figure 4B:
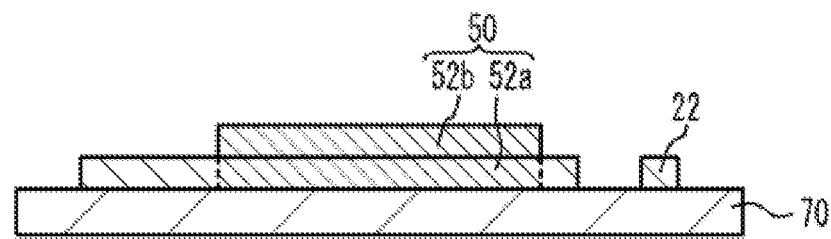

As shown in FIG. 4A, a polyimide resin or other resin material is applied on a polyethylene terephthalate film (PET film) or other film 70 according to the printing method, for example, to form an insulation layer 22 and a first layer 52a of low magnetic permeability part 50. As shown in FIG. 4B, a polyimide resin or other resin material is applied on the film 70 according to the printing method, for example, to form a second layer 52b of low magnetic permeability part 50 on top of the first layer 52a of low magnetic permeability part 50. The first layer 52a and second layer 52b together form a low magnetic permeability part 50.

Figure 4C:
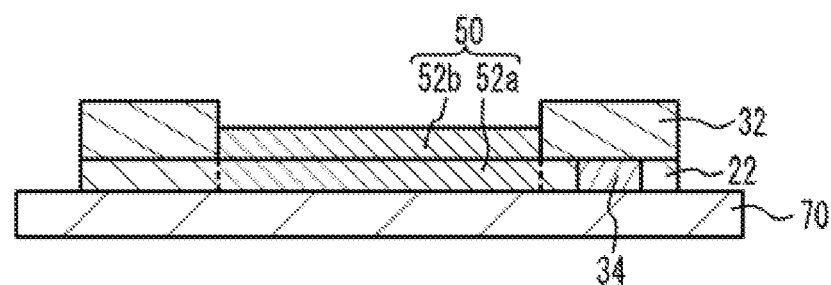
Figure 4D:
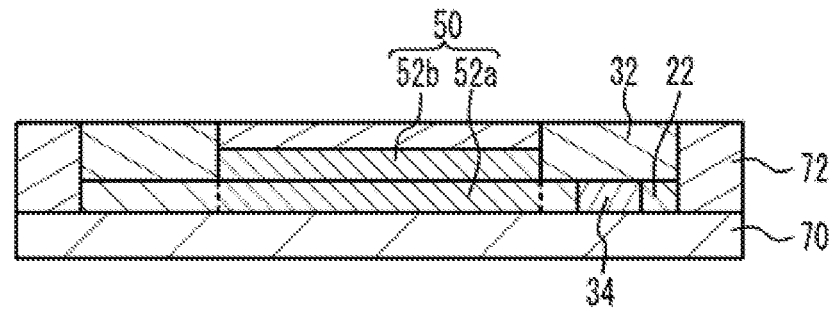
Figure 4E:
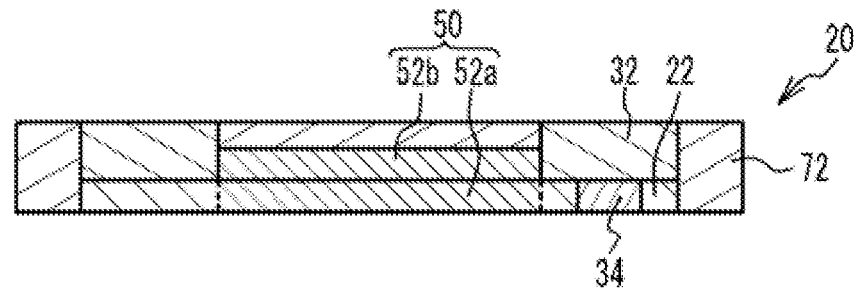

As shown in FIG. 4C, a conductive material is applied on the film 70 according to the printing method, for example, to form a precursor to a winding conductor 32 and a precursor to a connection conductor 34, which will constitute a coil 30. These precursors will become a winding conductor 32, and a connection conductor 34, respectively, when the below-mentioned heat treatment is applied. The area where a connection conductor 34 is formed should be prepared beforehand by providing a nonprinted area when the insulation layer 22 and first layer 52a of low magnetic permeability part 50 are formed, by partially removing the insulation layer 22 using a laser, etc., or by other method. As shown in FIG. 4D, a resin material constituted primarily by magnetic metal grains is applied on the film 70 according to the printing method, for example, to form a magnetic film 72. Then, as shown in FIG. 4E, the film 70 is peeled off. This way, the first type of layer (a layer that has an insulation layer 22 to be sandwiched by winding conductors 32, and a low magnetic permeability part 50) 20, among the multiple layers 20 that will constitute an element body part 10, is formed.

Figure 5A:
FIGS. 5A to 5D are cross-sectional views (Part 2) illustrating how the coil component pertaining to Example 1 is manufactured.
Figure 5B:
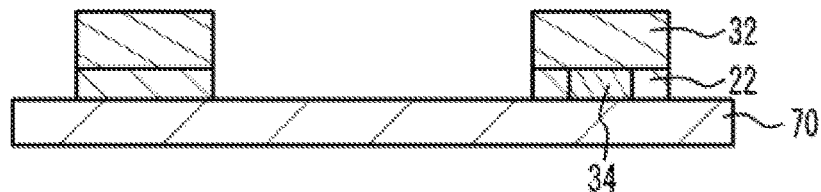
Figure 5C:
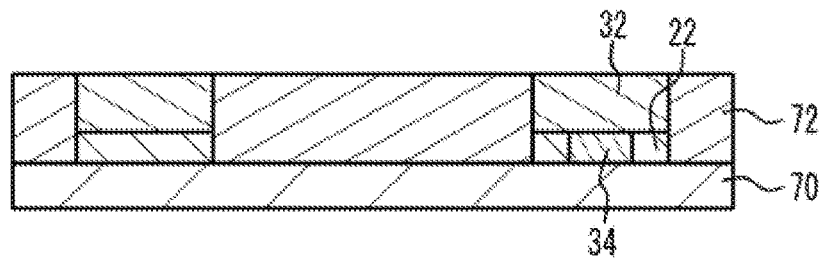
Figure 5D:
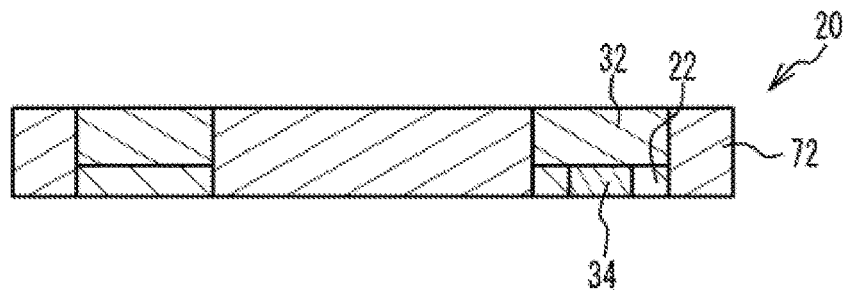

As shown in FIG. 5A, a polyimide resin or other resin material is applied on a film 70 according to the printing method, for example, to form an insulation layer 22. As shown in FIG. 5B, a conductive material is applied on the film 70 according to the printing method, for example, to form a precursor to a winding conductor 32 and that to a connection conductor 34, which will constitute a coil 30. These precursors will become a winding conductor 32, and a connection conductor 34, respectively, when the below-mentioned heat treatment is applied. The area where a connection conductor 34 is formed, should be prepared beforehand by providing a nonprinted area when the insulation layer 22 is formed, by partially removing the insulation layer 22 using a laser, etc., or by other method. As shown in FIG. 5C, a resin material constituted primarily by magnetic metal grains is applied on the film 70 according to the printing method, for example, to form a magnetic film 72. Then, as shown in FIG. 5D, the film 70 is peeled off. This way, the second type of layer (a layer that has an insulation layer 22 to be sandwiched by winding conductors 32) 20, among the multiple layers 20 that will constitute an element body part 10, is formed.

Figure 6A:
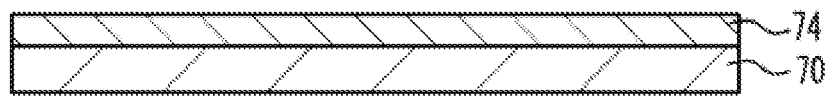
FIGS. 6A to 6D are cross-sectional views (Part 3) illustrating how the coil component pertaining to Example 1 is manufactured.
Figure 6B:
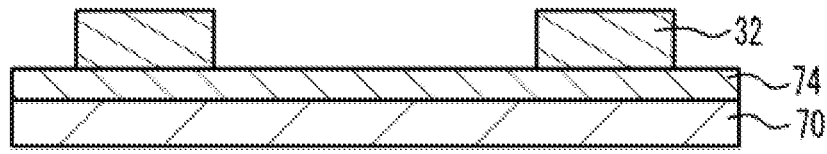
Figure 6C:
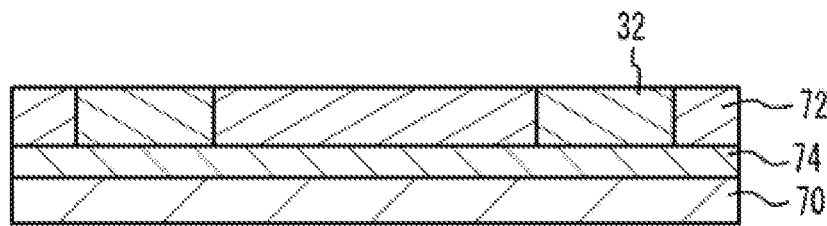
Figure 6D:
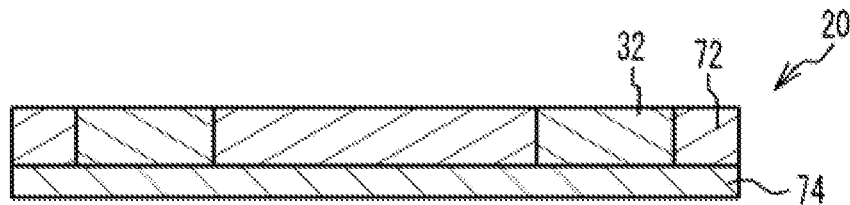

As shown in FIG. 6A, a resin material constituted primarily by magnetic metal grains is applied on a film 70 according to the doctor blade method or printing method, for example, to form a green sheet 74. As shown in FIG. 6B, a conductive material is applied on the green sheet 74 according to the printing method, for example, to form a precursor to a winding conductor 32 that will constitute a coil 30. This precursor will become a winding conductor 32 when the below-mentioned heat treatment is applied. As shown in FIG. 6C, a resin material constituted primarily by magnetic metal grains is applied on the film 70 according to the printing method, for example, to form a magnetic film 72. Then, as shown in FIG. 6D, the film 70 is peeled off. This way, the third type of layer (a layer that does not have any insulation layer 22 to be sandwiched by winding conductors 32) 20, among the multiple layers 20 that will constitute an element body part 10, is formed.

Also, how a cover layer 21 that will constitute an element body part 10 is manufactured, is explained using FIG. 6A. As shown in FIG. 6A, a resin material constituted primarily by magnetic metal grains is applied on a film 70 according to the doctor blade method or printing method, for example, to form a green sheet 74, after which the film 70 is peeled off. This way, a cover layer 21 is formed.

Layers (layers that each have an insulation layer 22 to be sandwiched by winding conductors 32, and a low magnetic permeability part 50) 20 formed according to FIGS. 4A to 4E, layers (layers that each have an insulation layer 22 to be sandwiched by winding conductors 32) 20 formed according to FIGS. 5A to 5D, and layers (layers that each do not have any insulation layer 22 to be sandwiched by winding conductors 32) 20 formed according to FIGS. 6A to 6D, and cover layers 21 explained using FIG. 6A, are stacked together in a specified order and then pressurized in the stacking direction to be pressure-bonded. Thereafter, the multiple pressure-bonded layers 20 and cover layers 21 are cut into individual chips, which are then heat-treated at a specified temperature (such as around 600° C. to 900° C.).

This way, element body parts 10, each constituted by a stack of multiple layers 20 and cover layers 21 and having a coil 30 inside which is formed by winding conductors 32 and connection conductors 34, are formed. Next, external electrodes 60a, 60b are formed on the surface of each element body part 10. The external electrodes 60a, 60b are formed by paste printing, plating, sputtering or other method used in thin film processes.

Figure 7A:
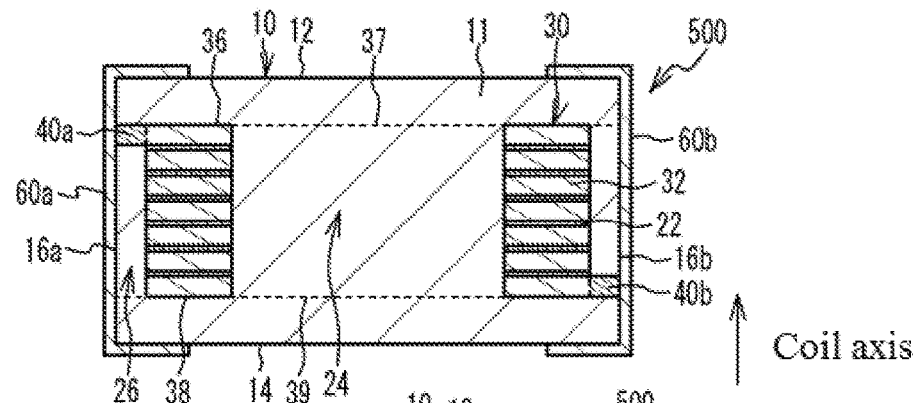
Figure 7B:
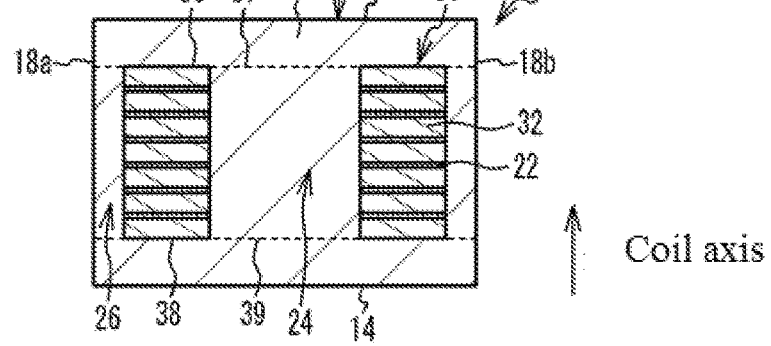
Figure 7C:
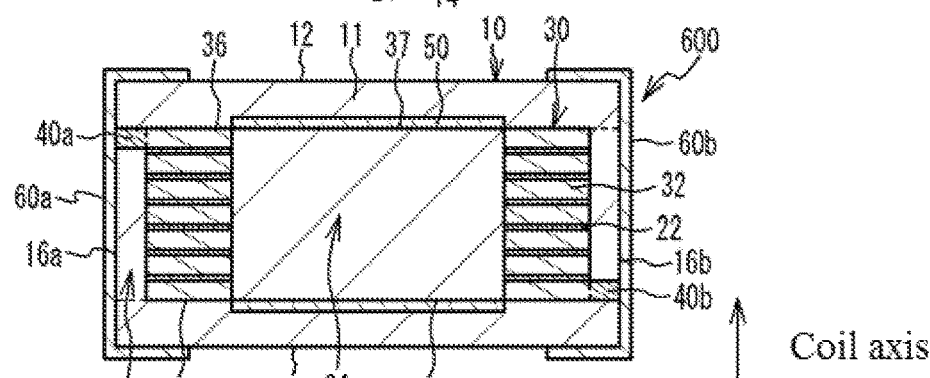
FIGS. 7C and 7D are cross-sectional views of the coil component pertaining to Comparative Example 2.
Figure 7D:
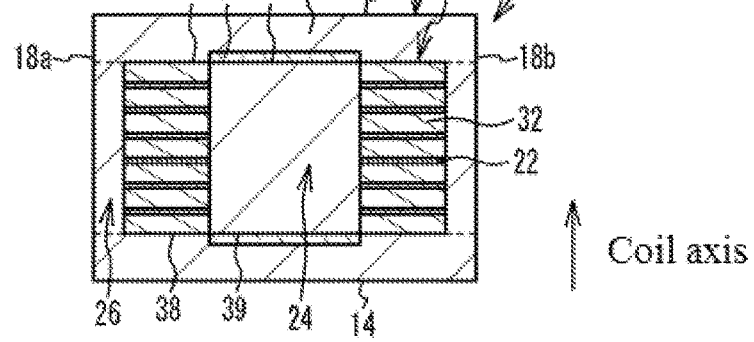

FIGS. 7A and 7B are cross-sectional views of the coil component pertaining to Comparative Example 1, while FIGS. 7C and 7D are cross-sectional views of the coil component pertaining to Comparative Example 2. As shown in FIGS. 7A and 7B, the coil component 500 pertaining to Comparative Example 1 has no low magnetic permeability part provided inside the element body part 10. The other constitutions are the same as those in Example 1 and therefore not explained. As shown in FIGS. 7C and 7D, the coil component 600 pertaining to Comparative Example 2 has one low magnetic permeability part 50 provided in the outer region 26 in a manner contacting at least one of the first surface 36 of the coil 30 and the inner region 24. The other low magnetic permeability part 50 is provided in the outer region 26 in a manner contacting at least one of the second surface 38 of the coil 30 and the inner region 24. The low magnetic permeability parts 50 are not provided in the inner region 24 surrounded by the coil 30. The other constitutions are the same as those in Example 1 and therefore not explained.

Now, the simulations of frequency properties of copper losses in the coil components pertaining to Example 1, Comparative Example 1, and Comparative Example 2, are explained. Since direct-current superimposition properties improve when low magnetic permeability parts 50 are provided at positions where they cut off magnetic flux, direct-current superimposition properties in Example 1 and Comparative Example 2 where there are low magnetic permeability parts 50, are better than in Comparative Example 1 where there is no low magnetic permeability part 50. Accordingly, copper losses, not direct-current superimposition properties, were simulated. It should be noted that copper losses are affected more by the alternating-current component at high frequencies of 10 MHz and higher. The simulated element body parts 10 were adjusted to 1.6 mm long in the long direction, 0.8 mm long in the short direction, and 0.65 mm high. The specific magnetic permeabilities of the main parts 11 of the element body parts 10 were adjusted to 40, 70, and 100 by assuming that their magnetic permeabilities should not be very high because the element body parts 10 were constituted primarily by magnetic metal grains. Seven layers of winding conductors 32 were stacked together, and the coils 30 were wound by 5.5 turns. The thicknesses of the low magnetic permeability parts 50, and heights and widths of the winding conductors 32, were adjusted so that the inductance values would become 0.22 pH and the direct-current resistances Rdc of the coils 30 would become 36 mΩ. Table 1 shows the specific magnetic permeabilities of the main parts 11 of the element body parts 10, thicknesses and specific magnetic permeabilities of the low magnetic permeability parts 50, per-layer heights, widths and specific magnetic permeabilities of the winding conductors 32, and per-layer thicknesses of the insulation layers 22.

TABLE 1

| | Element body part | Low magnetic permeability part | | Winding conductor | | | Insulation layer |
|---|---|---|---|---|---|---|---|
| | Relative permeability | Thickness (μm) | Relative permeability | Height (μm) | Width (μm) | Relative permeability | Thickness (μm) |
| Comparative Example 1 | 25 | — | | 51.4 | 195 | 1 | 8 |
| Comparative Example 2 | 40 | 7.0 | 1 | 51.4 | 195 | 1 | 8 |
| | 70 | 15.9 | 1 | | | | |
| | 100 | 20.0 | 1 | | | | |
| Example 1 | 40 | 7.3 | 1 | 51.4 | 195 | 1 | 8 |
| | 70 | 15.4 | 1 | | | | |
| | 100 | 18.9 | 1 | | | | |

Figure 8A:
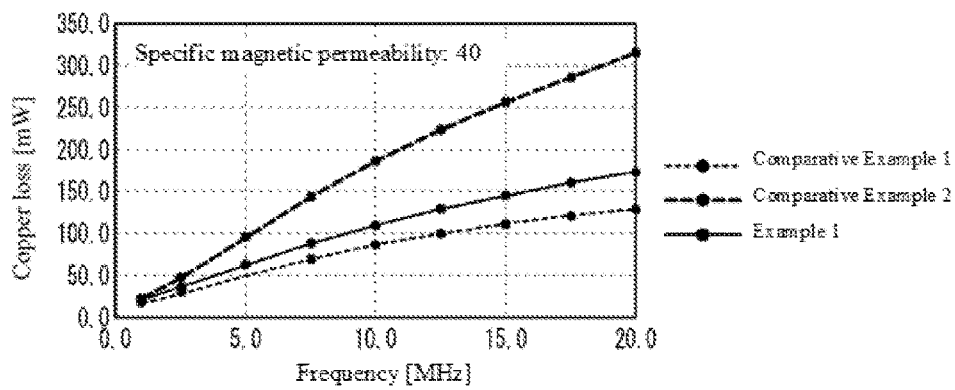
FIGS. 8A to 8C are diagrams showing the simulated results of frequency properties of copper losses in the coil components pertaining to Example 1, Comparative Example 1 and Comparative Example 2.
Figure 8B:
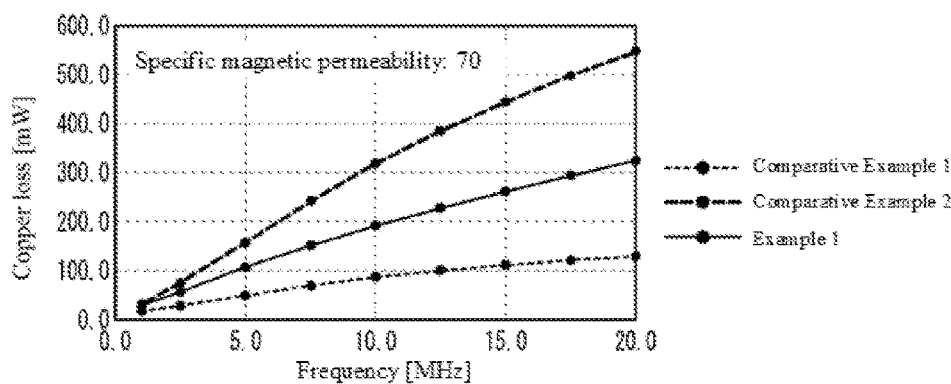
Figure 8C:
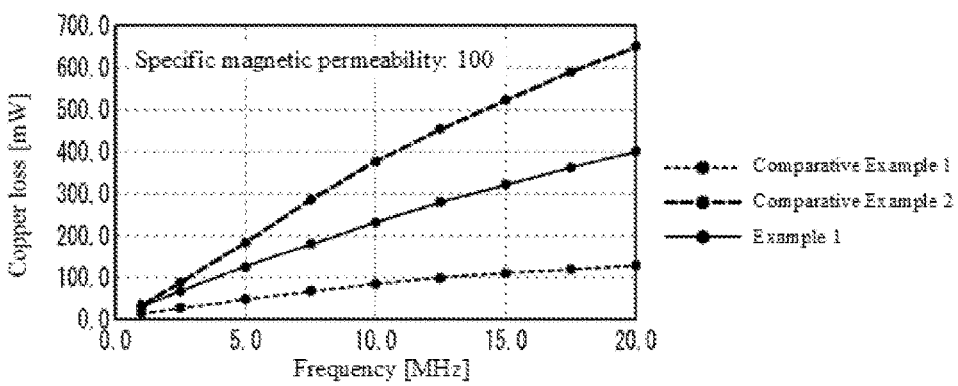

FIGS. 8A to 8C are diagrams showing the simulated results of frequency properties of copper losses in the coil components pertaining to Example 1, Comparative Example 1, and Comparative Example 2. FIG. 8A shows the simulated results based on the relative permeability of the main part 11 of the element body part 10 being 40, FIG. 8B shows the simulated results based on the relative permeability of the main part 11 of the element body part 10 being 70, and FIG. 8C shows the simulated results based on the relative permeability of the main part 11 of the element body part 10 being 100. As shown in FIGS. 8A to 8C, Example 1 resulted in lower copper losses compared to Comparative Example 2. For example, while the amount of drop in copper losses was not much more in Example 1 than in Comparative Example 2 at low frequencies of around 2 MHz to 3 MHz, Example 1 resulted in copper losses dropping significantly over the levels in Comparative Example 2 at high frequencies of 10 MHz and higher, with copper losses dropping even more at high frequencies of 15 MHz and higher.

Copper losses dropped more in Example 1 than in Comparative Example 2, as described above, probably because of the following reasons. In general, magnetic flux that passes through a substance has a propensity to travel straight so as to shorten its path as much as possible, as well as a propensity to pass through an area of the substance where the magnetic permeability is higher. When Comparative Example 2 is examined on the basis of this information, one low magnetic permeability part 50 is provided in the outer region 26 in a manner contacting at least one of the first surface 36 of the coil 30 and the inner region 24, while the other low magnetic permeability part 50 is provided in the outer region 26 in a manner contacting at least one of the second surface 38 of the coil 30 and the inner region 24, as shown in FIGS. 7C and 7D. This means that, as magnetic flux generating in the coil 30 travels in a circular path, a low magnetic permeability part 50 is present near the inner edges of the coil 30 where magnetic flux bends. In other words, magnetic flux, in this mode, passes through the winding conductors 32 so as to take a shorter path in the main part 11 of the element body part 10 where the relative permeability is high. Because magnetic flux passes through the winding conductors 32 of the coil 30, as explained above, eddy current generates in the coil 30. This generation of eddy current in the coil 30 is probably why Comparative Example 2 resulted in a high level of copper losses. Between the propensity of magnetic flux to pass through an area of a substance where magnetic permeability is high, and a propensity of magnetic flux to take the shortest path, the latter becomes dominant when magnetic permeability of the path that goes through both the main part 11 of the element body part 10 and the low magnetic permeability part 50 is low.

This happens when the relative permeability of the main part 11 of the element body part 10 is 100 or lower, and becomes more pronounced when this relative permeability is 70 or lower, or even more pronounced when it is 40 or lower. Also, regarding magnetic flux passing through the winding conductors 32 in order to take the shortest path, this tendency is evident when the difference between the relative permeability of the low magnetic permeability part 50 and that of the winding conductor 32 is 25 times or less, where the tendency becomes higher when this difference is 10 times or less, and even higher when the difference is five times or less.

In Example 1, on the other hand, the low magnetic permeability part 50 is provided inside the inner region 24 surrounded by the coil 30 between the first plane 37 that forms a plane flush with the first surface 36 of the coil 30, and the second plane 39 that forms a plane flush with the second surface 38 of the coil 30, in a manner away from the first plane 37 and the second plane 39, as shown in FIGS. 1B and 1C. This means that, as magnetic flux generating in the coil 30 travels in a circular path, only the main part 11 of the element body part 10 where relative permeability is high is present near the corners of the coil 30 where magnetic flux bends. This way, the passing of magnetic flux through the winding conductors 32 can be prevented, even when the relative permeability of the main part 11 of the element body part 10 is not sufficiently high and the relative permeability of the low magnetic permeability part 50 is close in level to that of the winding conductor 32. This is because, even when the magnetic permeability of the path that goes through both the main part 11 of the element body part 10 and the low magnetic permeability part 50 is low, this magnetic flux path is still the shortest path. As a result, the generation of eddy current in the coil 30 is prevented, and this probably explains why copper losses decreased. The frequencies used by electronic devices equipped with coil components are becoming increasingly higher, and the magnetic metal grains with which to form their element body parts 10 are becoming smaller in size and more insulated from each other. As a result, iron losses generating in the element body parts 10 are decreasing. This means that, by keeping copper losses low, total losses can be kept low.

According to Example 1, the low magnetic permeability part 50 is provided between the first plane 37 that forms a plane flush with the first surface 36 of the coil 30, and the second plane 39 that forms a plane flush with the second surface 38 of the coil 30, in a manner away from the first plane 37 and the second plane 39, as shown in FIGS. 1B and 1C. This can improve direct-current superimposition properties over what can be achieved in Comparative Example 1 where no low magnetic permeability part 50 is provided, while still keeping losses low, as explained in FIGS. 8A to 8C. Also, the inner region 24 surrounded by the coil 30 is where magnetic flux concentrates. As shown in FIGS. 1B and 1C, direct-current superimposition properties can be effectively improved by providing the low magnetic permeability part 50 inside the inner region 24 surrounded by the coil 30. In the case of Comparative Example 2, on the other hand, one low magnetic permeability part 50 is provided in the outer region 26 in a manner contacting at least one of the first surface 36 of the coil 30 and the inner region 24, while the other low magnetic permeability part 50 is provided in the outer region 26 in a manner contacting at least one of the second surface 38 of the coil 30 and the inner region 24, as shown in FIGS. 7C and 7D. No low magnetic permeability part 50 is provided between the first plane 37 that forms a plane flush with the first surface 36 of the coil 30, and the second plane 39 that forms a plane flush with the second surface 38 of the coil 30. As a result, direct-current superimposition properties improve over what can be achieved in Comparative Example 1 where no low magnetic permeability part 50 is provided, but losses increase, as explained in FIGS. 8A to 8C.

Figure 9A:
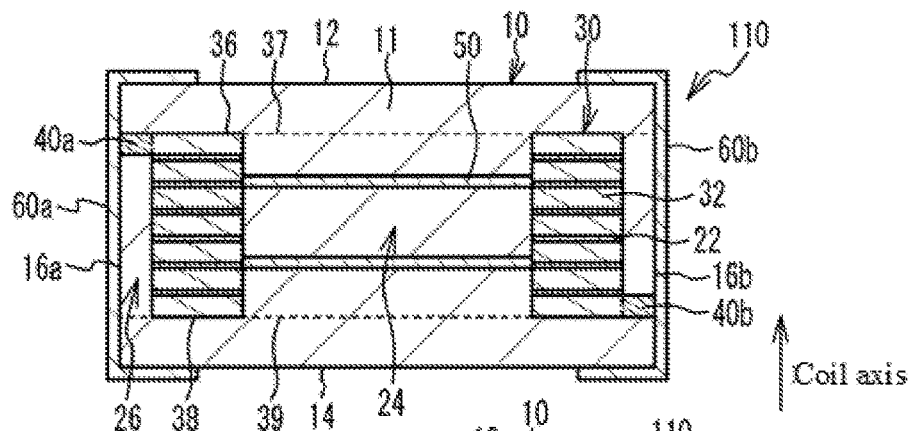
Figure 9B:
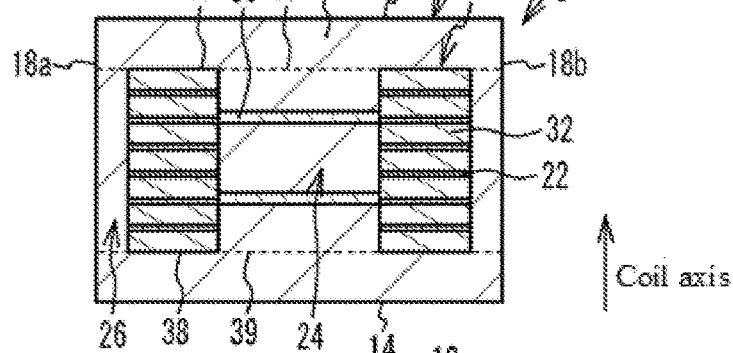
Figure 9C:
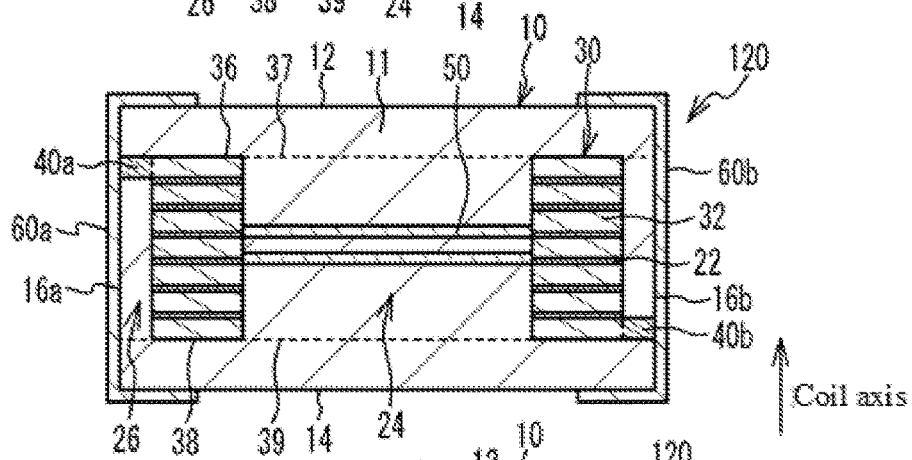
FIGS. 9C and 9D are cross-sectional views of the coil component pertaining to Variation Example 2 of Example 1.
Figure 9D:
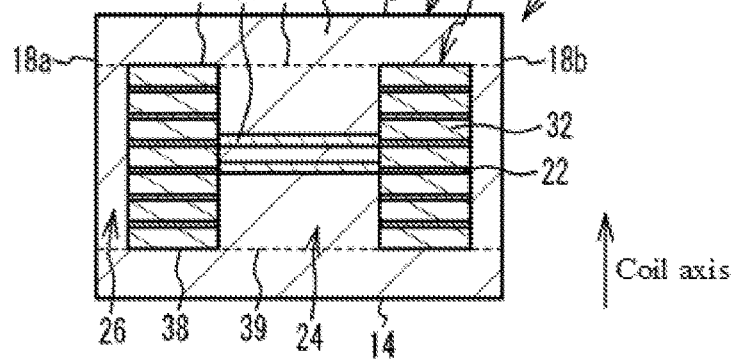

FIGS. 9A and 9B are cross-sectional views of the coil component pertaining to Variation Example 1 of Example 1, while FIGS. 9C and 9D are cross-sectional views of the coil component pertaining to Variation Example 2 of Example 1. As shown in FIGS. 9A and 9B, the coil component 110 in Variation Example 1 of Example 1 has one low magnetic permeability part 50 provided in the inner region 24 at a position between the second layer and third layer of winding conductors 32, and the other low magnetic permeability part 50 provided in the inner region 24 at a position between the fifth layer and sixth layer of winding conductors 32. The other constitutions are the same as those in Example 1 and therefore not explained. As shown in FIGS. 9C and 9D, the coil component 120 pertaining to Variation Example 2 of Example 1 has one low magnetic permeability part 50 provided in the inner region 24 at a position between the third layer and fourth layer of winding conductors 32, and the other low magnetic permeability part 50 provided in the inner region 24 at a position between the fourth layer and fifth layer of winding conductors 32. The other constitutions are the same as those in Example 1 and therefore not explained.

Figure 10A:
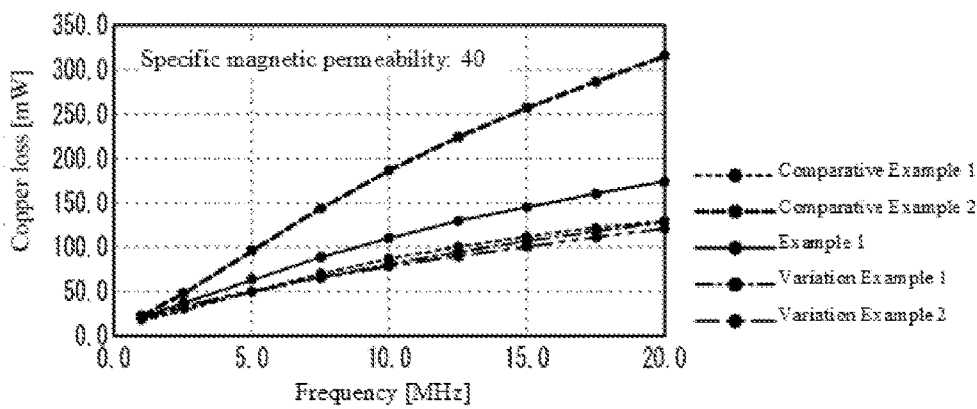
FIGS. 10A to 10C are diagrams showing the simulated results of frequency properties of copper losses in the coil components pertaining to Example 1, Variation Example 1 of Example 1, Variation Example 2 of Example 1, Comparative Example 1, and Comparative Example 2.
Figure 10B:
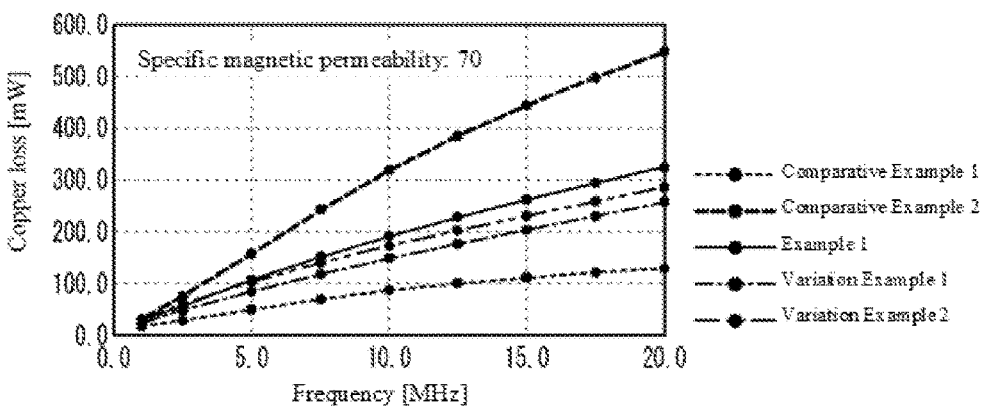
Figure 10C:
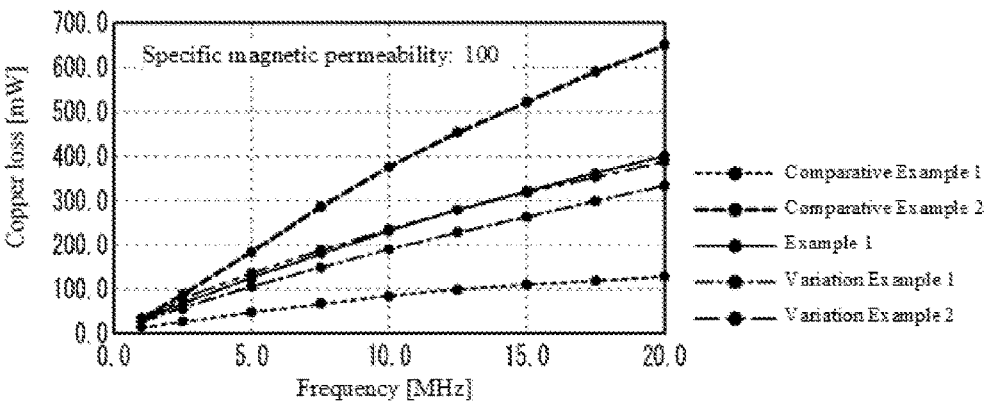

FIGS. 10A to 10C are diagrams showing the simulated results of frequency properties of copper losses in the coil components pertaining to Example 1, Variation Example 1 of Example 1, Variation Example 2 of Example 1, Comparative Example 1, and Comparative Example 2. It should be noted that, in the simulations of Variation Example 1 of Example 1 and Variation Example 2 of Example 1, the element body parts 10 were adjusted to 1.6 mm long in the long direction, 0.8 mm long in the short direction, and 0.65 mm high, just like in FIGS. 8A to 8C. The specific magnetic permeabilities of the main parts 11 of the element body parts 10 were adjusted to 40, 70, and 100. Seven layers of winding conductors 32 were stacked together, and the coils 30 were wound by 5.5 turns. The thicknesses of the low magnetic permeability parts 50, and heights and widths of the winding conductors 32, were adjusted so that the inductance values would become 0.22 µH and the direct-current resistances Rdc of the coils 30 would become 36 mΩ. Table 2 shows the specific magnetic permeabilities of the main parts 11 of the element body parts 10, thicknesses and specific magnetic permeabilities of the low magnetic permeability parts 50, per-layer heights, widths, and specific magnetic permeabilities of the winding conductors 32, and per-layer thicknesses of the insulation layers 22.

TABLE 2

| | Element body part | Low magnetic permeability part | | Winding conductor | | | Insulation layer |
|---|---|---|---|---|---|---|---|
| | Relative permeability | Thickness (µm) | Relative permeability | Height (µm) | Width (µm) | Relative permeability | Thickness (µm) |
| Variation Example 1 of Example 1 | 40 | 7.1 | 1 | 51.4 | 195 | 1 | 8 |
| | 70 | 15.0 | 1 | | | | |
| | 100 | 18.4 | 1 | | | | |
| Variation Example 2 of Example 1 | 40 | 7.1 | 1 | 51.4 | 195 | 1 | 8 |
| | 70 | 15.4 | 1 | | | | |
| | 100 | 19.1 | 1 | | | | |

As shown in FIGS. 10A to 10C, copper losses in Variation Example 1 of Example 1 and Variation Example 2 of Example 1 became lower than in Comparative Example 2, just like in Example 1. This is probably due to the same reason explained in connection with Example 1. These results show that the effect of lowering copper losses can be achieved so long as the low magnetic permeability parts 50 are provided in the inner region 24 surrounded by the coil 30, regardless of the positions in the direction of the coil axis at which the low magnetic permeability parts 50 are provided.

As shown in FIGS. 1B and 1C, preferably the low magnetic permeability parts 50 are provided in the inner region 24 surrounded by the coil 30, on the inner side of the outer region 26, but not in the outer region 26 present on the side of the coil 30 closer to the surface of the element body part 10. This means that the low magnetic permeability parts 50 are provided in the inner region 24 of the coil 30 where magnetic flux concentrates, and consequently direct-current superimposition properties can be effectively improved.

As shown in FIG. 2B, preferably the low magnetic permeability part 50 is provided in a manner covering the entire cross-section of the inner region 24 surrounded by the coil 30, as viewed from the direction of the coil axis. This means that the low magnetic permeability part 50 is provided in a manner covering the area where magnetic flux tends to concentrate, and consequently direct-current superimposition properties can be effectively improved.

As shown in FIGS. 1B and 1C, preferably the low magnetic permeability parts 50 are provided at positions between the multiple winding conductors 32 that are stacked together. This means that, as shown in FIGS. 4A to 4E, the low magnetic permeability parts 50 can be formed when the insulation layers 22 are formed, which improves the formability of low magnetic permeability parts 50.

It should be noted that, in Example 1, low magnetic permeability parts may be provided on side faces of winding conductors 32 that are facing the inner region 24, and the side faces of winding conductors 32 that are facing the inner region 24 may be covered by the low magnetic permeability parts.

Example 2

Figure 11A:
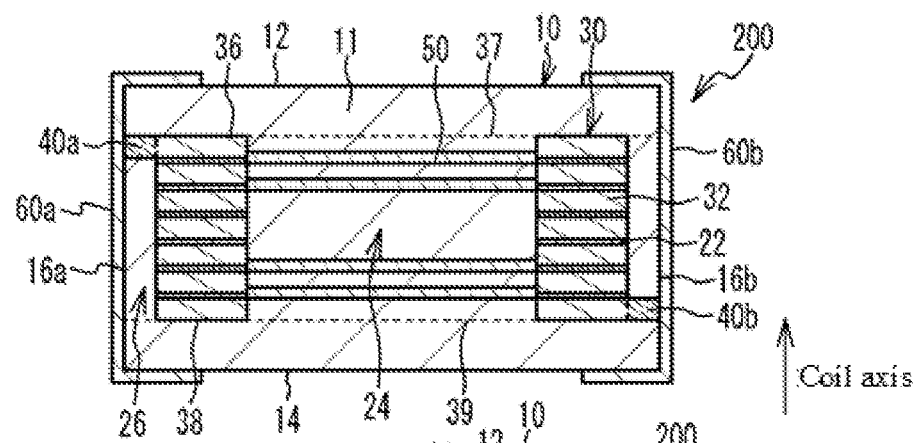
Figure 11B:
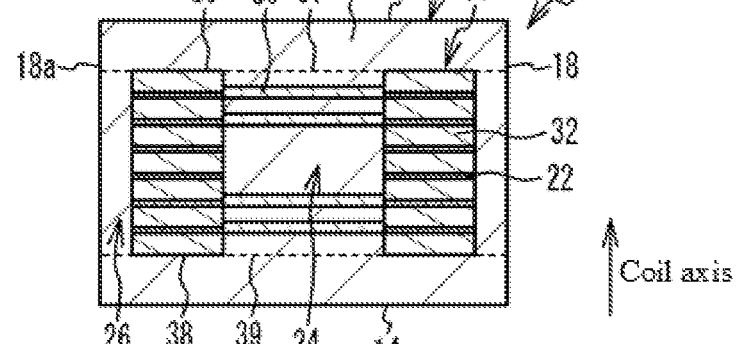
Figure 11C:
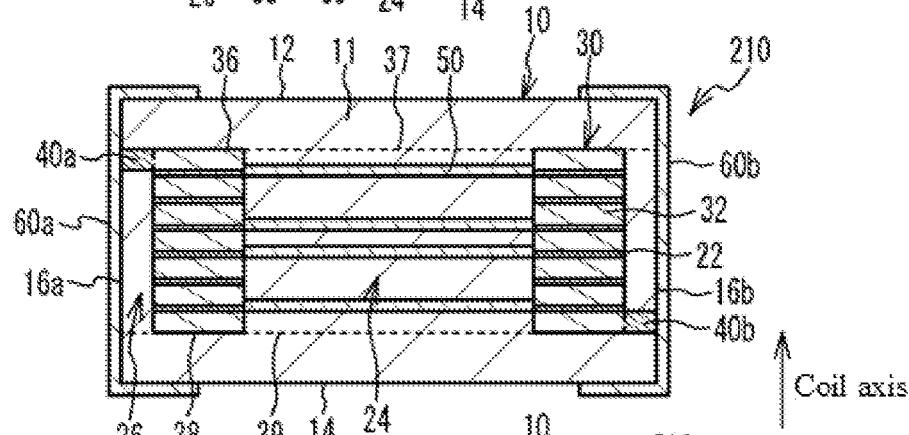
FIGS. 11C and 11D are cross-sectional views of the coil component pertaining to Variation Example 1 of Example 2.
Figure 11D:
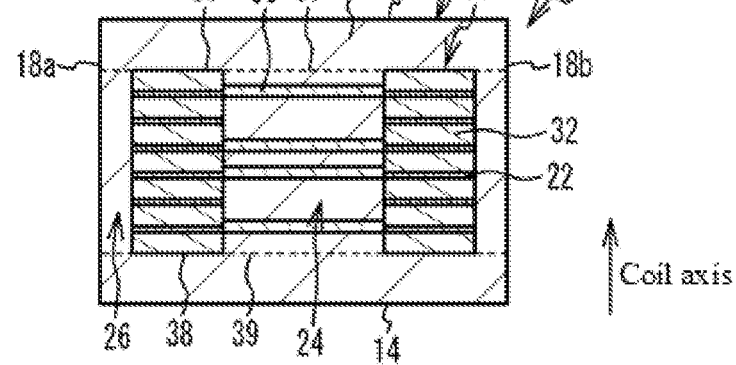
Figure 12A:
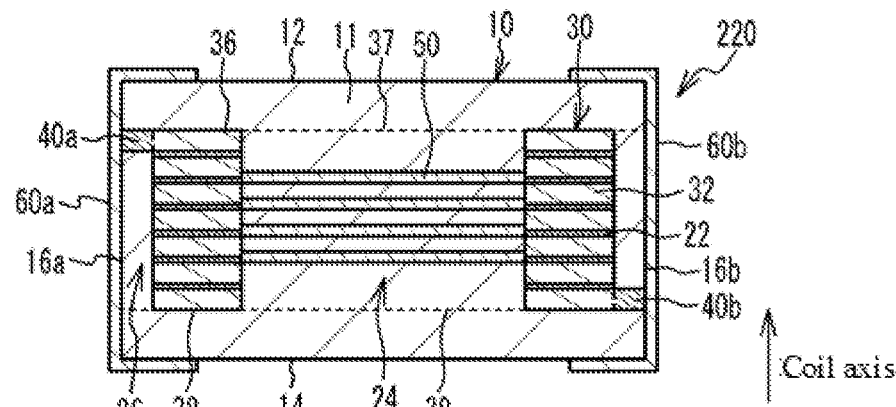
Figure 12B:
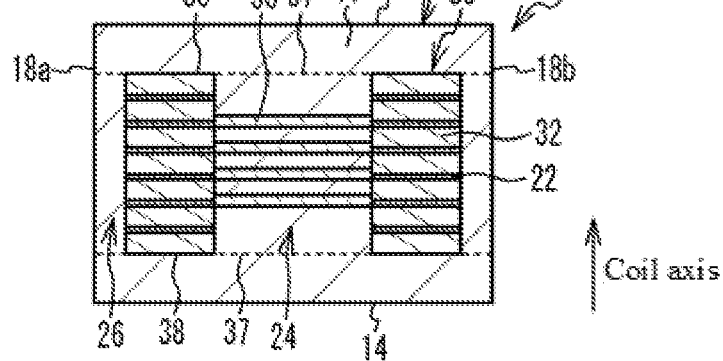
Figure 12C:
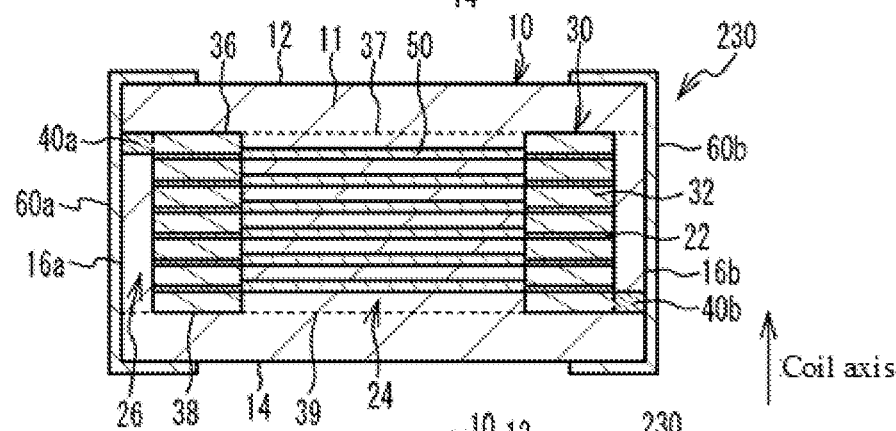
FIGS. 12C and 12D are cross-sectional views of the coil component pertaining to Variation Example 3 of Example 2.
Figure 12D:
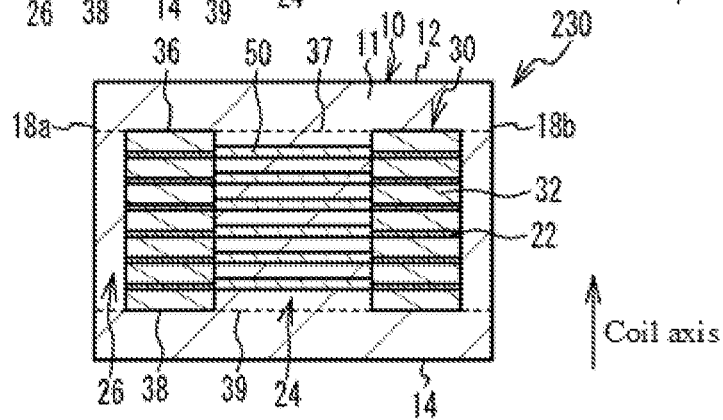

In Example 1, an example where two layers of low magnetic permeability parts are provided in the inner region 24 surrounded by the coil 30 was illustrated; in Example 2, on the other hand, an example where four or six layers of low magnetic permeability parts are provided is explained. FIGS. 11A and 11B are cross-sectional views of the coil component pertaining to Example 2, while FIGS. 11C and 11D are cross-sectional views of the coil component pertaining to Variation Example 1 of Example 2. FIGS. 12A and 12B are cross-sectional views of the coil component pertaining to Variation Example 2 of Example 2, while FIGS. 12C and 12D are cross-sectional views of the coil component pertaining to Variation Example 3 of Example 2.

As shown in FIGS. 11A and 11B, the coil component 200 in Example 2 has four layers of low magnetic permeability parts 50 provided in the inner region 24 surrounded by the coil 30. The first layer of low magnetic permeability part 50 is provided in the inner region 24 at a position between the first layer and second layer of winding conductors 32, while the second layer of low magnetic permeability part 50 is provided in the inner region 24 at a position between the second layer and third layer of winding conductors 32. The third layer of low magnetic permeability part 50 is provided in the inner region 24 at a position between the fifth layer and sixth layer of winding conductors 32, while the fourth layer of low magnetic permeability part 50 is provided in the inner region 24 at a position between the sixth layer and seventh layer of winding conductors 32. The other constitutions are the same as those in Example 1 and therefore not explained.

As shown in FIGS. 11C and 11D, the coil component 210 in Variation Example 1 of Example 2 has four layers of low magnetic permeability parts 50 provided in the inner region 24 surrounded by the coil 30. The first layer of low magnetic permeability part 50 is provided in the inner region 24 at a position between the first layer and second layer of winding conductors 32, while the second layer of low magnetic permeability part 50 is provided in the inner region 24 at a position between the third layer and fourth layer of winding conductors 32. The third layer of low magnetic permeability part 50 is provided in the inner region 24 at a position between the fourth layer and fifth layer of winding conductors 32, while the fourth layer of low magnetic permeability part 50 is provided in the inner region 24 at a position between the sixth layer and seventh layer of winding conductors 32. The other constitutions are the same as those in Example 1 and therefore not explained.

As shown in FIGS. 12A and 12B, the coil component 220 in Variation Example 2 of Example 2 has four layers of low magnetic permeability parts 50 provided in the inner region 24 surrounded by the coil 30. The first layer of low magnetic permeability part 50 is provided in the inner region 24 at a position between the second layer and third layer of winding conductors 32, while the second layer of low magnetic permeability part 50 is provided in the inner region 24 at a position between the third layer and fourth layer of winding conductors 32. The third layer of low magnetic permeability part 50 is provided in the inner region 24 at a position between the fourth layer and fifth layer of winding conductors 32, while the fourth layer of low magnetic permeability part 50 is provided in the inner region 24 at a position between the fifth layer and sixth layer of winding conductors 32. The other constitutions are the same as those in Example 1 and therefore not explained.

As shown in FIGS. 12C and 12D, the coil component 230 in Variation Example 3 of Example 2 has six layers of low magnetic permeability parts 50 provided in the inner region 24 surrounded by the coil 30. The first layer of low magnetic permeability part 50 is provided in the inner region 24 at a position between the first layer and second layer of winding conductors 32, while the second layer of low magnetic permeability part 50 is provided in the inner region 24 at a position between the second layer and third layer of winding conductors 32. The third layer of low magnetic permeability part 50 is provided in the inner region 24 at a position between the third layer and fourth layer of winding conductors 32, while the fourth layer of low magnetic permeability part 50 is provided in the inner region 24 at a position between the fourth layer and fifth layer of winding conductors 32. The fifth layer of low magnetic permeability part 50 is provided in the inner region 24 at a position between the fifth layer and sixth layer of winding conductors 32, while the sixth layer of low magnetic permeability part 50 is provided in the inner region 24 at a position between the sixth layer and seventh layer of winding conductors 32. The other constitutions are the same as those in Example 1 and therefore not explained.

Figure 13A:
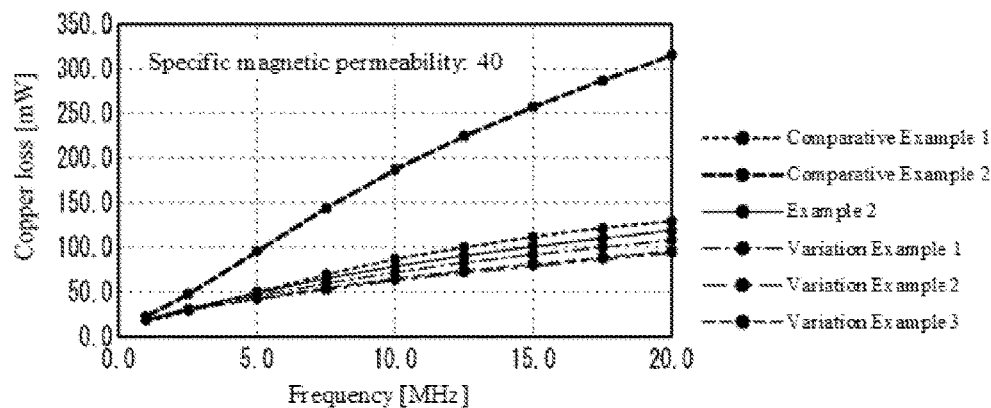
FIGS. 13A to 13C are diagrams showing the simulated results of frequency properties of copper losses in the coil components pertaining to Example 2, Variation Example 1 of Example 2, Variation Example 2 of Example 2, Variation Example 3 of Example 2, Comparative Example 1, and Comparative Example 2.
Figure 13B:
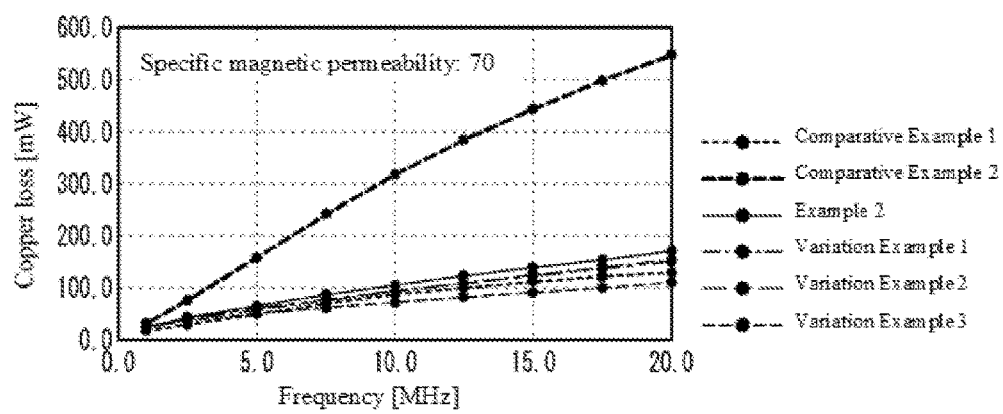
Figure 13C:
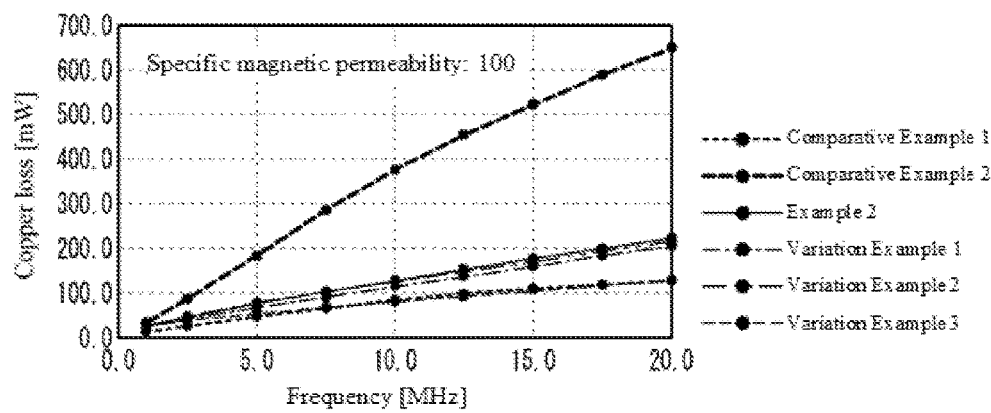

FIGS. 13A to 13C are diagrams showing the simulated results of frequency properties of copper losses in the coil components pertaining to Example 2, Variation Example 1 of Example 2, Variation Example 2 of Example 2, Variation Example 3 of Example 2, Comparative Example 1, and Comparative Example 2. It should be noted that, in the simulations of Example 2 through Variation Example 3 of Example 2, the element body parts 10 were adjusted to 1.6 mm long in the long direction, 0.8 mm long in the short direction, and 0.65 mm high, just like in FIGS. 8A to 8C. The specific magnetic permeabilities of the main parts 11 of the element body parts 10 were adjusted to 40, 70, and 100. Seven layers of winding conductors 32 were stacked together, and the coils 30 were wound by 5.5 turns. The thicknesses of the low magnetic permeability parts 50, and heights and widths of the winding conductors 32, were adjusted so that the inductance values would become 0.22 µH and the direct-current resistances Rdc of the coils 30 would become 36 mΩ. Table 3 shows the specific magnetic permeabilities of the main parts 11 of the element body parts 10, thicknesses and specific magnetic permeabilities of the low magnetic permeability parts 50, per-layer heights, widths, and specific magnetic permeabilities of the winding conductors 32, and per-layer thicknesses of the insulation layers 22.

TABLE 3

| | Element body part | Low magnetic permeability part | | Winding conductor | | | Insulation layer |
|---|---|---|---|---|---|---|---|
| | Relative permeability | Thickness (μm) | Relative permeability | Height (μm) | Width (μm) | Relative permeability | Thickness (μm) |
| Example 2 | 40 | 3.5 | 1 | 51.4 | 195 | 1 | 8 |
| | 70 | 7.3 | 1 | | | | |
| | 100 | 8.9 | 1 | | | | |
| Variation Example 1 of Example 2 | 40 | 3.4 | 1 | 51.4 | 195 | 1 | 8 |
| | 70 | 7.2 | 1 | | | | |
| | 100 | 8.8 | 1 | | | | |
| Variation Example 2 of Example 2 | 40 | 3.4 | 1 | 51.4 | 195 | 1 | 8 |
| | 70 | 7.3 | 1 | | | | |
| | 100 | 8.9 | 1 | | | | |
| Variation Example 3 of Example 2 | 40 | 2.3 | 1 | 51.4 | 195 | 1 | 8 |
| | 70 | 4.7 | 1 | | | | |
| | 100 | 5.8 | 1 | | | | |

Figure 14A:
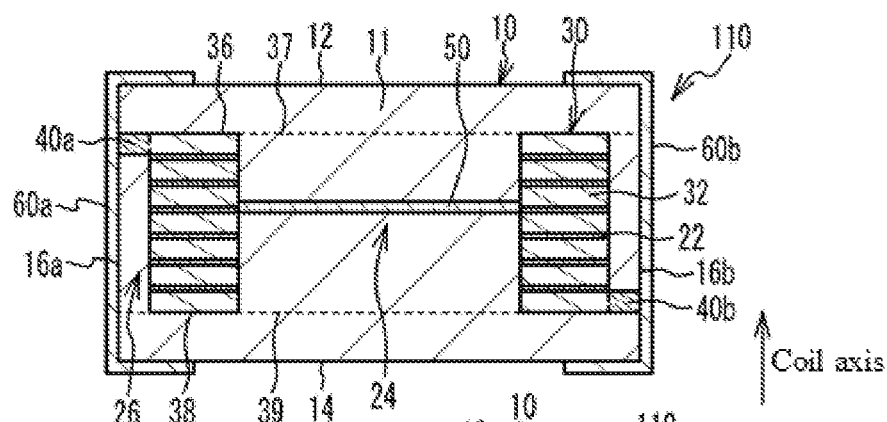
Figure 14B:
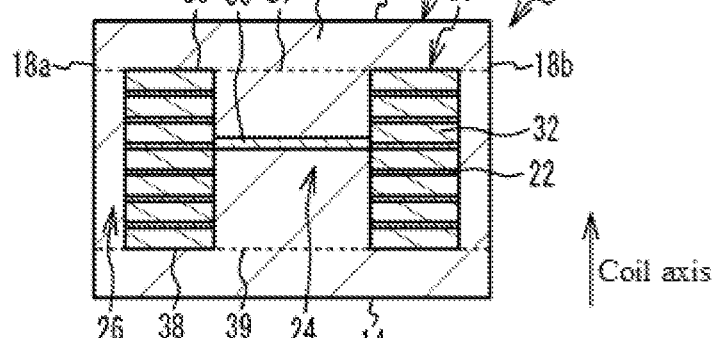
Figure 14C:
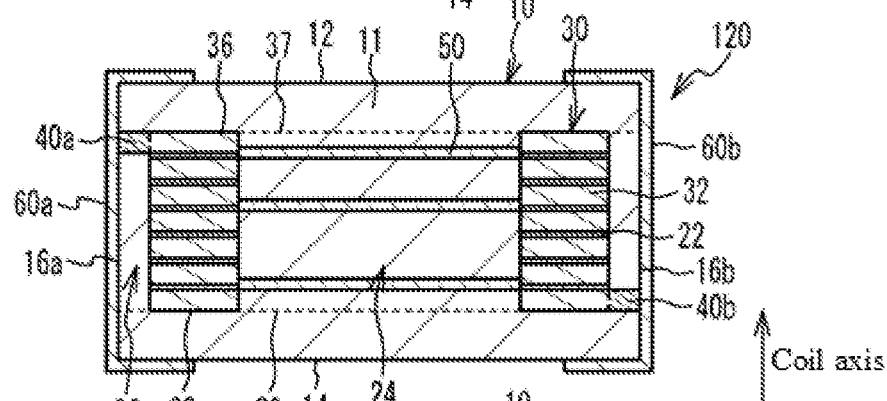
FIGS. 14C and 14D are cross-sectional views showing three layers of the low magnetic permeability part provided in the inner region surrounded by the coil.
Figure 14D:
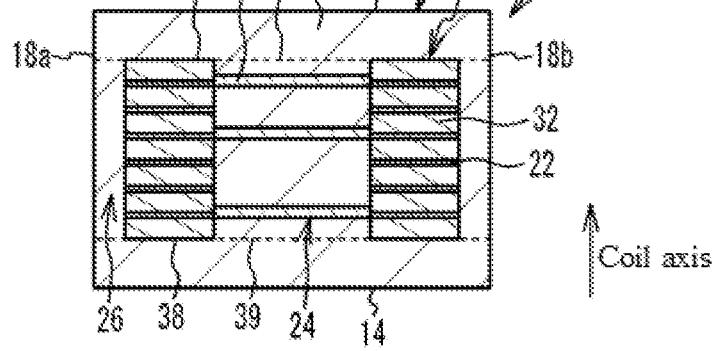

As shown in FIGS. 13A to 13C, copper losses in Example 2 through Variation Example 3 of Example 2 also became lower than in Comparative Example 2. This is probably due to the same reason explained in connection with Example 1. These results show that the effect of lowering copper losses can be achieved, not only when two layers of low magnetic permeability parts are provided, but also when four, six or other multiple numbers of layers of them are provided, in the inner region 24 surrounded by the coil 30. In addition, it can be said in light of the reason explained in Example 1 that the effect of lowering copper losses can also be achieved when one layer of low magnetic permeability part 50 is provided in the inner region 24 surrounded by the coil 30, as shown in FIGS. 14A and 14B, and also when three layers of low magnetic permeability parts 50 are provided in the inner region 24 surrounded by the coil 30, as shown in FIGS. 14C and 14D.

Preferably multiple low magnetic permeability parts 50 are provided in the inner region 24 surrounded by the coil 30. This way, the thickness of each of the low magnetic permeability parts 50 can be adjusted to the same level as the thickness of the insulation layer 22, while at the same time the total thickness of the multiple low magnetic permeability parts 50 can be increased in order to improve direct-current superimposition properties. As a result, the low magnetic permeability parts 50 can be formed at the same time as the insulation layers 22, which helps improve the formability of the low magnetic permeability parts 50. From the viewpoint of improving the formability of the low magnetic permeability parts 50, preferably the thickness of the low magnetic permeability part 50 is the same as the thickness of the insulation layer 22. It should be noted that, regarding the term "same thickness," thicknesses that are different by no more than a manufacturing error are considered the same.

As shown in Tables 1 to 3, preferably the total thickness, in the direction of the coil axis, of the low magnetic permeability parts 50 provided in the inner region 24 surrounded by the coil 30 is smaller than 40 μm when the relative permeability of the main part 11 of the element body part 10 is 100 or lower. In other words, the total thickness T μm of the low magnetic permeability parts 50 in the direction of the coil axis is preferably equal to or greater than one-fifth, but no greater than one-half, the relative permeability $\mu_r$ of the main part 11 of the element body part 10 ($\mu_r/5 \leq T \leq \mu_r/2$), or more preferably equal to or greater than one-fourth, but no greater than one-half, the relative permeability μr of the main part 11 of the element body part 10 ($\mu_r/4 \leq T \leq \mu_r/2$), or even more preferably equal to or greater than one-third, but no greater than one-half, the relative permeability $\mu_r$ of the main part 11 of the element body part 10 ($\mu_r/3 \leq T \leq \mu_r/2$). This way, losses can be improved while improving direct-current superimposition properties at the same time.

In Examples 1 and 2, examples where the low magnetic permeability part 50 is formed by a resin material, inorganic insulating material, etc., were illustrated; however, this part may be formed by other material or it may be a void. Also, the low magnetic permeability part 50 may be formed by a material whose dielectric constant is 10 or lower. In this case, the self-resonance frequency moves toward the high-frequency side and high-frequency properties can be improved as a result. Also, in Examples 1 and 2, examples where the low magnetic permeability part 50 is provided only in the inner region 24 were illustrated. This way, magnetic flux that leaks out of the coil component from the outer region decreases, and the volume of the element body part in the outer region can be reduced as a result. In other words, the cross-sectional area as viewed from the direction of the coil axis, of the outer region 26 of the main part 11 of the element body part 10, can be made smaller than that of the inner region 24, which helps reduce the size of the coil component as a whole. In providing the low magnetic permeability part 50, however, it is a known art to provide a low magnetic permeability part 50 at a position where it cuts off magnetic flux and thereby improves direct-current superimposition properties; accordingly, the low magnetic permeability part 50 may be provided between the first plane 37 that forms a plane flush with the first surface 36 of the coil 30, and the second plane 39 that forms a plane flush with the second surface 38 of the coil 30, in a manner away from the first plane 37 and the second plane 39, and it is present in the outer region 26 on the side of the coil 30 closer to the surface of the element body part 10. In this case, the volume of the element body part 10 in the outer region 26 can be increased and therefore magnetic flux that leaks out of the coil component can be decreased, compared to when the low magnetic permeability part 50 is provided only in the inner region 24. In other words, by making the cross-sectional area of the outer region 26 of the main part 11 of the element body part 10 greater than that of the inner region 24, the coil component can be better shielded and therefore the coil component can be placed at a shorter distance from such other coil component while preventing interference, etc., between the components. Also, the low magnetic permeability part 50 may be provided in both the inner region 24 and the outer region 26, so long as every such part is provided between the first plane 37 that forms a plane flush with the first surface 36 of the coil 30, and the second plane 39 that forms a plane flush with the second surface 38 of the coil 30, in a manner away from the first plane 37 and the second plane 39. Examples 1 and 2 provided the most favorable examples where the low magnetic permeability part 50 is provided only in the inner region 24 where magnetic flux concentrates; however, the same effects can also be achieved in other cases.

In Examples 1 and 2, examples where the coil component is a multi-layer inductor were illustrated. Specifically, in the illustrated examples, the element body part 10 is formed by stacking together multiple layers 20 that include winding conductors 32 and connection conductors 34 that will form a coil 30, and magnetic films 72 constituted primarily by magnetic metal grains. However, the coil component is not limited to a multi-layer inductor, and it may be a thin-film inductor or other type of coil component. Also, a method whereby magnetic metal grains and resin are kneaded together and the resulting composite material is made into sheets that are then stacked together, or a method whereby such composite material is hardened by heat or pressure, may be used, for example.

Figure 15:
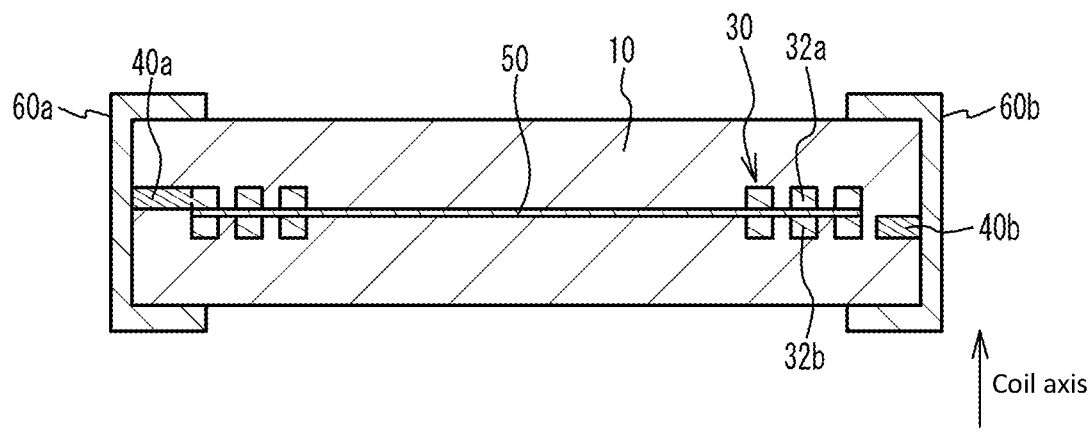
FIG. 15 is a cross-sectional view of a coil component being a thin-film inductor.

FIG. 15 is a cross-sectional view of a coil component being a thin-film inductor. As shown in FIG. 15, a coil 30 that includes winding conductors 32a, 32b is built into an element body part 10. The winding conductors 32a, 32b turn helically in the direction of crossing at right angles with the coil axis, and their ends are connected together. The low magnetic permeability part 50 is provided at a position between the winding conductors 32a, 32b.

Example 3

Figure 16:
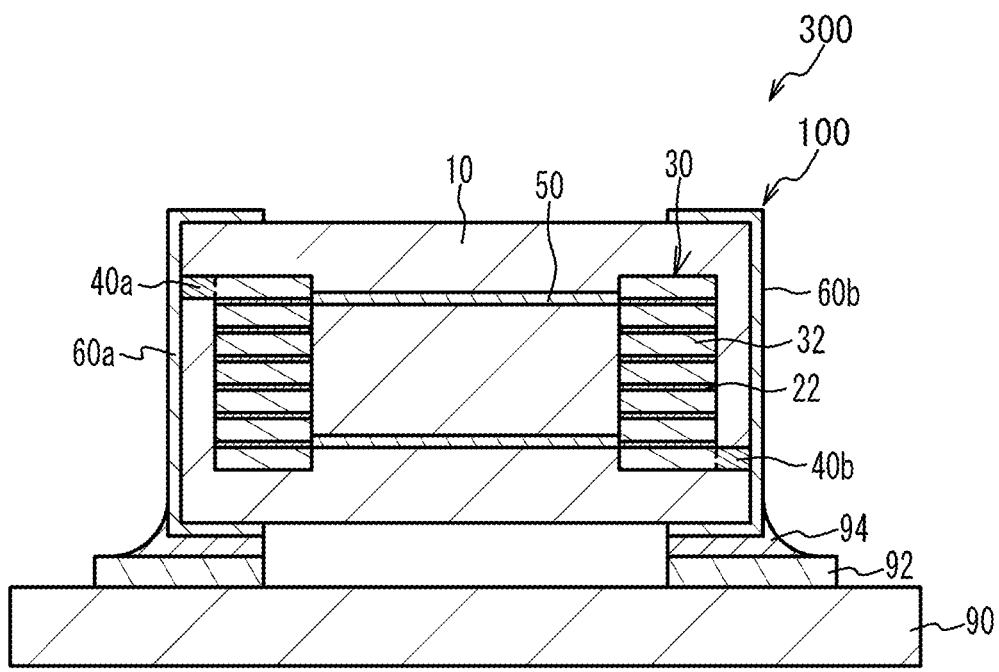
FIG. 16 is a cross-sectional view of the electronic device pertaining to Example 3.

FIG. 16 is a cross-sectional view of the electronic device pertaining to Example 3. As shown in FIG. 16, the electronic device 300 in Example 3 comprises a circuit board 90 and a coil component 100 according to Example 1 being mounted on the circuit board 90. The coil component 100 is mounted on the circuit board 90 as a result of its external electrodes 60a, 60b joined to electrodes 92 of the circuit board 90 via a solder 94.

According to the electronic device 300 in Example 3, the coil component 100 is mounted on the circuit board 90. This means that the obtained electronic device 300 is equipped with the coil component 100 that demonstrates improved direct-current properties and is subject to lower losses.

It should be noted that, while Example 3 illustrated an example where a coil component 100 according to Example 1 is mounted on a circuit board 90, a coil component according to any of Variation Example 1 of Example 1 through Variation Example 3 of Example 2 may be mounted instead.

The foregoing described the examples of the present invention in detail; it should be noted, however, that the present invention is not limited to these specific examples and that various modifications and changes can be added to the extent that they do not affect the key points of the present invention described in "What Is Claimed Is."

In the present disclosure where conditions and/or structures are not specified, a skilled artisan in the art can readily provide such conditions and/or structures, in view of the present disclosure, as a matter of routine experimentation. Also, in the present disclosure including the examples described above, any ranges applied in some embodiments may include or exclude the lower and/or upper endpoints, and any values of variables indicated may refer to precise values or approximate values and include equivalents, and may refer to average, median, representative, majority, etc. in some embodiments. Further, in this disclosure, "a" may refer to a species or a genus including multiple species, and "the invention" or "the present invention" may refer to at least one of the embodiments or aspects explicitly, necessarily, or inherently disclosed herein. The terms "constituted by" and "having" refer independently to "typically or broadly comprising", "comprising", "consisting essentially of", or "consisting of" in some embodiments. In this disclosure, any defined meanings do not necessarily exclude ordinary and customary meanings in some embodiments.

The present application claims priority to Japanese Patent Application No. 2018-053182, filed Mar. 20, 2019, the disclosure of which is incorporated herein by reference in its entirety including any and all particular combinations of the features disclosed therein.

It will be understood by those of skill in the art that numerous and various modifications can be made without departing from the spirit of the present invention. Therefore, it should be clearly understood that the forms of the present invention are illustrative only and are not intended to limit the scope of the present invention.

We claim:

1. A coil component comprising:
an element body part that contains magnetic metal grains and nonmagnetic material and has insulation property; and
a coil that is embedded in the element body part and formed by a winding conductor;
wherein:
the element body part has a main part and at least one low magnetic permeability part whose relative permeability is lower than that of the main part;
the coil has a first surface and a second surface that respectively represent surfaces positioned on opposite sides in a direction of a coil axis and intersecting the coil axis; and
the low magnetic permeability part is provided between a first plane that forms a plane flush with the first surface of the coil, and a second plane that forms a plane flush with the second surface of the coil, in a manner away from the first plane and the second plane,
wherein the low magnetic permeability part is provided at least in an inner region enclosed by the coil as viewed in the direction of the coil axis.

2. The coil component according to claim 1, wherein the at least one low magnetic permeability part of the element body part is constituted by multiple low magnetic permeability parts.

3. The coil component according to claim 1, wherein a relative permeability of the main part of the element body part is 100 or lower, and a total thickness of the low magnetic permeability part(s) in the direction of the coil axis is smaller than 40 μm.

4. The coil component according to claim 1, wherein a relative permeability of the main part of the element body part is 100 or lower, and a total thickness T μm of the low magnetic permeability part(s) in the direction of the coil axis is equal to or greater than one-fifth, but no greater than one-half, a relative permeability $\mu_r$ of the main part of the element body part ($\mu_r/5 \leq T \leq \mu_r/2$).

5. The coil component according to claim 1, wherein the element body part is formed by multiple layers, each of which includes of the conductor that forms the coil and a magnetic film constituted primarily by the magnetic metal grains.

6. The coil component according to claim 5, wherein the low magnetic permeability part is positioned between the conductor in a layer and the conductor in an adjacent layer of the multiple layers.

7. The coil component according to claim 1, further comprising external electrodes provided on a surface of the element body part, and lead conductors provided inside the element body part and connecting ends of the coil to the external electrodes.

8. An electronic device comprising the coil component according to claim 1 and a circuit board on which the coil component is mounted.

9. A coil component comprising:
an element body part that contains magnetic metal grains and nonmagnetic material and has insulation property; and
a coil that is embedded in the element body part and formed by a winding conductor;
wherein:
the element body part has a main part and at least one low magnetic permeability part whose relative permeability is lower than that of the main part;
the coil has a first surface and a second surface that respectively represent surfaces positioned on opposite sides in a direction of a coil axis and intersecting the coil axis; and
the low magnetic permeability part is provided between a first plane that forms a plane flush with the first surface of the coil, and a second plane that forms a plane flush with the second surface of the coil, in a manner away from the first plane and the second plane,
wherein the low magnetic permeability part is provided in an inner region enclosed by the coil, on an inner side of an outer region which is present outside the coil closer to outer surfaces of the element body part.

10. The coil component according to claim 9, wherein the low magnetic permeability part is provided in a manner covering an entire cross-section, taken in a direction perpendicular to the direction of the coil axis, of the inner region surrounded by the coil, as viewed from the direction of the coil axis.

* * * * *